(12) United States Patent
Ohashi et al.

(10) Patent No.: US 12,093,021 B2
(45) Date of Patent: *Sep. 17, 2024

(54) SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Naofumi Ohashi, Toyama (JP); Toshiyuki Kikuchi, Toyama (JP); Shun Matsui, Toyama (JP); Tadashi Takasaki, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/355,738

(22) Filed: Jul. 20, 2023

(65) Prior Publication Data
US 2023/0359175 A1    Nov. 9, 2023

Related U.S. Application Data

(63) Continuation of application No. 17/725,181, filed on Apr. 20, 2022, now Pat. No. 11,747,789, which is a
(Continued)

(30) Foreign Application Priority Data

Sep. 18, 2018  (JP) .................. 2018-173540

(51) Int. Cl.
G05B 19/416 (2006.01)
H01L 21/67 (2006.01)
H01L 21/677 (2006.01)

(52) U.S. Cl.
CPC ...... *G05B 19/416* (2013.01); *H01L 21/67167* (2013.01); *H01L 21/67781* (2013.01); *G05B 2219/45031* (2013.01)

(58) Field of Classification Search
CPC ........ G05B 19/416; G05B 2219/45031; H01L 21/67781; H01L 21/67167;
(Continued)

(56) References Cited

U.S. PATENT DOCUMENTS 9,312,155 B2    4/2016    Mori et al.
2005/0129839 A1  6/2005    Numakura
(Continued)

FOREIGN PATENT DOCUMENTS

CN    106558516 A    4/2017
JP    2003-332405 A    11/2003
(Continued)

OTHER PUBLICATIONS

Taiwanese Office Action, Taiwanese Patent Application No. 108127352, Mar. 18, 2021.
Korean Office Action, Korean Patent Application No. 10-2019-0092893, Sep. 28, 2020.
Taiwanese Office Action, Taiwanese Patent Application No. 108127352, Jul. 22, 2020.
(Continued)

*Primary Examiner* — Christopher E. Everett
(74) *Attorney, Agent, or Firm* — Volpe Koenig

(57) ABSTRACT

There is provided a technique that includes a load port on which a plurality of storage containers, each storage container storing a plurality of substrates, are mounted, a plurality of process chambers configured to be capable of accommodating the substrates, a transfer part configured to transfer the substrates stored in each storage container to each of the process chambers; an operation part configured to, when performing the process in a state in which a substrate is not present in each process chamber, count first count data of data tables for corresponding process chambers; a memory configured to store the data tables; and a
(Continued)

controller configured to assign first transfer flag data to a data table of a process chamber having largest first count data and configured to control the transfer part based on the first transfer flag data so as to transfer the substrates in the predetermined order.

17 Claims, 16 Drawing Sheets

Related U.S. Application Data continuation of application No. 16/528,184, filed on Jul. 31, 2019, now Pat. No. 11,314,234.

(58) Field of Classification Search
CPC ......... H01L 21/67276; H01L 21/67196; H01L 21/67742
See application file for complete search history.

(56) References Cited

U.S. PATENT DOCUMENTS

| | | |
|---|---|---|
| 2005/0187647 A1 | 8/2005 | Wang et al. |
| 2015/0040828 A1 | 2/2015 | Morisawa et al. |
| 2017/0092517 A1 | 3/2017 | Ohashi et al. |
| 2018/0024536 A1 | 1/2018 | Yoneda |

FOREIGN PATENT DOCUMENTS

| | | |
|---|---|---|
| JP | 6089082 B1 | 3/2017 |
| JP | 2017-069315 A | 4/2017 |
| WO | 2016/157402 A1 | 10/2016 |

OTHER PUBLICATIONS

Japanese Office Action, Japanese Patent Application No. 2018-173540, Mar. 4, 2020.
Chinese Office Action, Chinese Patent Application No. 201910710017.9, Nov. 2, 2022.

FIG. 10

| PM m | 1 | | 2 | | 3 | | 4 | |
|---|---|---|---|---|---|---|---|---|
| Chamber n | 100a | 100b | 100c | 100d | 100e | 100f | 100g | 100i |
| Wafer No. | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 |   | 1 | 1 | 1 | 1 | 1 | 1 |
| |   | 1 | 1 |   | 1 | 1 | 1 | 1 |
| |   | 1 | 1 | 1 | 1 | 1 | 1 | 1 |
| |   | 1 | 1 |   | 1 | 1 | 1 | 1 |
| | 1 | 1 | 1 | 1 | 1 | 1 | 1 | 1 |
| | 1 | 1 | 1 | 1 | 1 | 1 | 1 | 1 |
| | 1 | 1 | 1 | 1 | 1 | 1 | 1 | 1 |
| |   | 1 | 1 | 1 | 1 | 1 | 1 | 1 |
| |   | 1 | 1 | 1 | 1 | 1 | 1 | 1 |
| |   | 1 | 1 | 1 | 1 | 1 | 1 | 1 |
| | 1 | 1 | 1 | 1 | 1 | 1 | 1 |   |
| | 1 |   | 1 | 1 | 1 | 1 | 1 | 1 |
| |   | 1 | 1 |   | 1 | 1 | 1 | 1 |
| |   | 1 | 1 | 1 | 1 | 1 | 1 | 1 |
| | 1 |   |   | 1 |   | 1 | 1 | 1 |
| |   | 1 | 1 | 1 | 1 | 1 | 1 | 1 |
| |   | 1 | 1 | 1 | 1 | 1 | 1 | 1 |
| | 1 | 1 | 1 | 1 | 1 | 1 | 1 | 1 |
| |   | 1 | 1 | 1 | 1 | 1 | 1 | 1 |
| |   | 1 | 1 | 1 |   | 1 | 1 | 1 |
| |   | 1 | 1 | 1 | 1 | 1 | 1 | 1 |
| |   | 1 | 1 | 1 | 1 | 1 | 1 |   |

| PM m | 1 | | 2 | | 3 | | 4 | | Maximum value- Minimum value |
|---|---|---|---|---|---|---|---|---|---|
| Chamber n | 100a | 100b | 100c | 100d | 100e | 100f | 100g | 100i | |
| Integrated process time | 26 | 24 | 26 | 24 | 26 | 24 | 26 | 24 | 2 |

Integrated process time (bar chart: 100a=26, 100b=24, 100c=26, 100d=24, 100e=26, 100f=24, 100g=26, 100i=24)

FIG. 12

| Chamber<br>1st or 2nd count data | Chamber 100a | Chamber 100b | Chamber 100c | ... | Chamber 100i |
|---|---|---|---|---|---|
| Integrated process time<br>※Substrate present<br>[Arbitrary unit] | A1　400 | B1　300 | C1　300 | ... | I1　300 |
| Integrated time of maintenance temperature<br>[Arbitrary unit] | A2　1200 | B2　1200 | C2　1200 | ... | I2　1200 |
| Integrated supply amount of process gas<br>[Arbitrary unit] | A3　500 | B3　500 | C3　500 | ... | I3　500 |
| Integrated maintenance time of process pressure<br>[Arbitrary unit] | A4　400 | B4　300 | C4　300 | ... | I4　300 |
| (Cumulative film thickness)<br>[Arbitrary unit] | A5　3 | B5　2 | C5　2 | ... | I5　2 |
| (High-frequency power supply amount)<br>[Arbitrary unit] | A6　400 | B6　300 | C6　300 | ... | I6　300 |

FIG. 13

| Chamber<br>1st or 2nd count data | PM1 | | PM2 | ... | PM4 |
|---|---|---|---|---|---|
| | Chamber 100a | Chamber 100b | Chamber 100c | ... | Chamber 100i |
| Integrated process time<br>※Substrate present<br>[Arbitrary unit] | A1  400 | B1  300 | C1  300 | ...  ... | I1  300 |
| Transfer flag | Xa  1 | Xb  0 | Xc  0 | ...  ... | Xi  0 |

FIG. 14

| Chamber<br>1st or 2nd count data | PM1 | | PM2 | | ... | PM4 | |
|---|---|---|---|---|---|---|---|
| | Chamber 100a | Chamber 100b | Chamber 100c | Chamber 100d | ... | Chamber 100h | Chamber 100i |
| Integrated process time<br>※Substrate not present | A1<br>400 | B1<br>0 | C1<br>300 | D1<br>300 | ... | H1<br>300 | I1<br>300 |
| Third count data<br>Integrated process time<br>※Substrate not present | AB1<br>400 | | CD1<br>600 | | ... | HI1<br>600 | |
| Transfer flag<br>※Substrate not present | Xab<br>0 | | Xcd<br>1 | | ... | Xhi<br>0 | |

FIG. 15

| Film thickness data [Arbitrary unit] \ Measurement | Measurement 1 | Measurement 2 | Measurement 3 |
|---|---|---|---|
| Process chamber wall surface | A1　1 | B1　2 | C1　3 |
| Transfer flag data | f1　1 | f2　1 | f3　2 |

FIG. 16

| Film thickness data [Arbitrary unit] \ Measurement | Measurement 1 | Measurement 2 | Measurement 3 |
|---|---|---|---|
| Substrate support part | A2　0.5 | B2　1.0 | C2　2 |
| Transfer flag data | F1　2 | F2　2 | F3　1 |

FIG. 17

| Film thickness data [Arbitrary unit] \ Measurement | Measurement 1 | Measurement 2 | Measurement 3 |
|---|---|---|---|
| Process chamber wall surface | A1   2 | B1   3 | C1   2 |
| Substrate support part | A2   3 | B2   2 | C2   2 |
| Dispersion plate | A3   2 | B3   2 | C3   3 |
| Transfer flag data | F1   1 | F2   2 | F3   2 |

SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is a continuation of U.S. patent application Ser. No. 17/725,181, filed Apr. 20, 2022, which is a continuation of U.S. application Ser. No. 16/528,184, filed Jul. 31, 2019 and issued as U.S. Pat. No. 11,314,234, dated Apr. 26, 2022, which is based upon and claims the benefit of priority from Japanese Patent Application No. 2018-173540, filed on Sep. 18, 2018, the entire contents of which are incorporated herein by reference.

TECHNICAL FIELD

The present disclosure relates to a substrate processing apparatus, a method of manufacturing a semiconductor device, and a recording medium.

BACKGROUND

In the recent manufacture of a semiconductor device, the trend of a small lot and multiple products has been in progress. It is desired to improve the productivity in this small lot/multiple product kind production. As one of the methods to meet this demand, there is a method of improving the productivity in a single-substrate type processing apparatus having a plurality of process chambers.

There is a problem that the productivity is reduced due to the mismatch between the number of process chambers provided at a processing apparatus and the number of processed wafers.

SUMMARY

Some embodiments of the present disclosure provide a technique capable of improving the productivity in a processing apparatus having a plurality of process chambers.

According to one embodiment of the present disclosure, there is provided a technique that includes a load port on which a plurality of storage containers, each storing a plurality of substrates, are mounted; a plurality of process chambers configured to be capable of accommodating the plurality of substrates; a transfer part configured to transfer the plurality of substrates stored in each of the plurality of storage containers to each of the plurality of process chambers; an operation part configured to, when transferring the plurality of substrates from one storage container among the plurality of storage containers to each of the plurality of process chambers in a predetermined order for a process and performing the process in a state in which a substrate is not present in each of the plurality of process chambers, count first count data of data tables for corresponding process chambers; a memory configured to store the data tables; and a controller configured to assign first transfer flag data to a data table of the process chamber having largest first count data among the data tables and configured to, when the plurality of substrates stored in the next storage container of the one storage container is transferred, control the transfer part based on the first transfer flag data so as to transfer the plurality of substrates in the predetermined order.

BRIEF DESCRIPTION OF DRAWINGS

FIG. 10 is a diagram showing an integrated process time according to a conventional transfer sequence.

FIG. 12 is a diagram showing an example of a data table of a first count data according to an embodiment.

FIG. 13 is a diagram showing an example of a first count data and a transfer flag according to an embodiment.

FIG. 14 is a diagram showing an example of a third count data and a transfer flag according to an embodiment.

FIG. 15 is a diagram showing an example of a film thickness table according to an embodiment.

FIG. 16 is a diagram showing an example of a film thickness table according to an embodiment.

FIG. 17 is a diagram showing an example of a film thickness table according to an embodiment.

DETAILED DESCRIPTION

Figure 1:
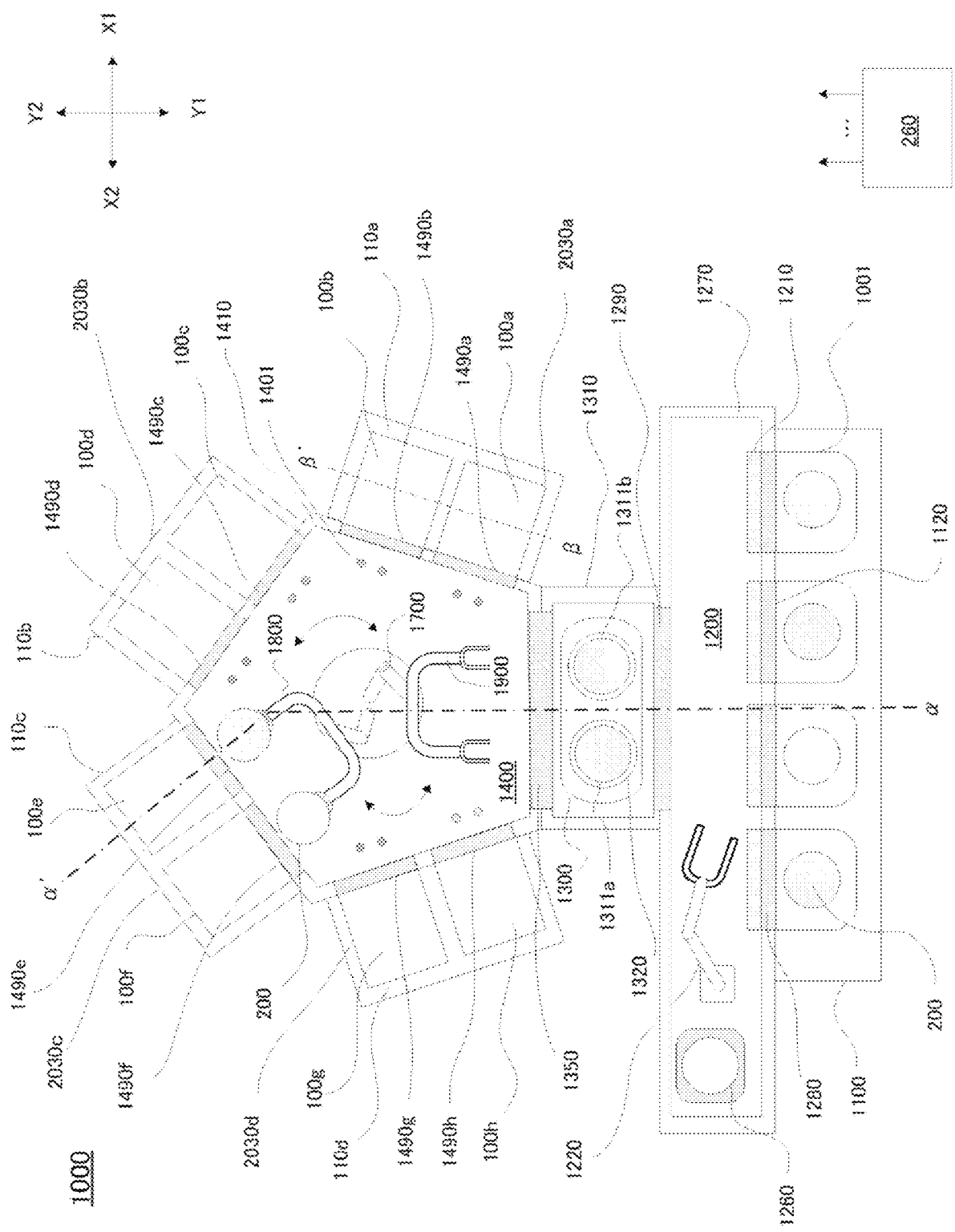
FIG. 1 is a schematic view showing a horizontal cross section of a substrate processing system according to an embodiment.

Embodiments of the present disclosure will be now described in detail with reference to the drawings. Like or equivalent components, members, and processes illustrated in each drawing are given like reference numerals and a repeated description thereof will be properly omitted. Further, the embodiments are presented by way of example only, and are not intended to limit the present disclosure, and any feature or combination thereof described in the embodiments may not necessarily be essential to the present disclosure.

First Embodiment

A first embodiment of the present disclosure will now be described with reference to the drawings.

A substrate processing system according to the present embodiment will be described below.

(1) Configuration of Substrate Processing System

Figure 2:
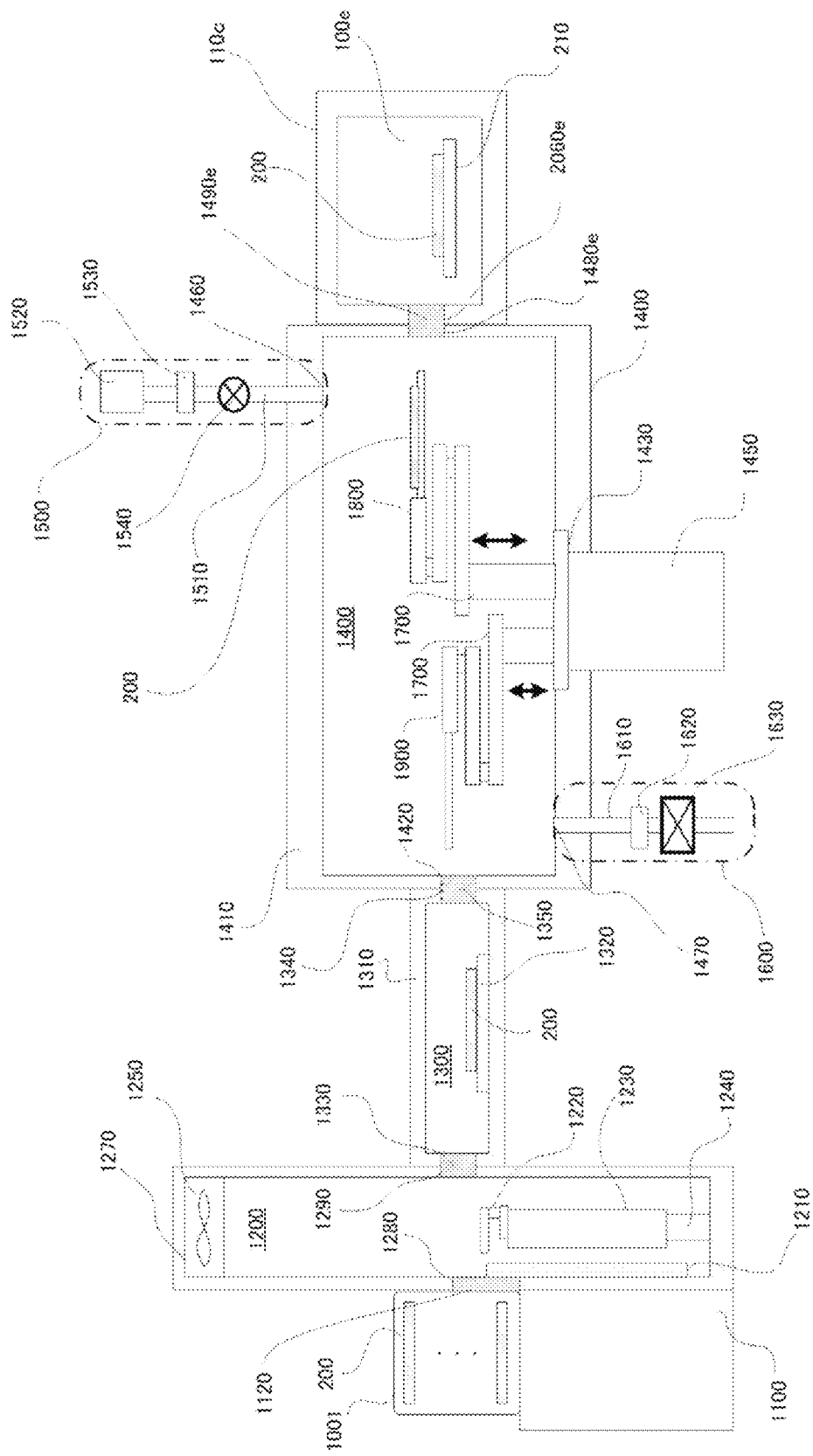
FIG. 2 is a schematic view showing a vertical cross section of the substrate processing system according to an embodiment.
Figure 3:
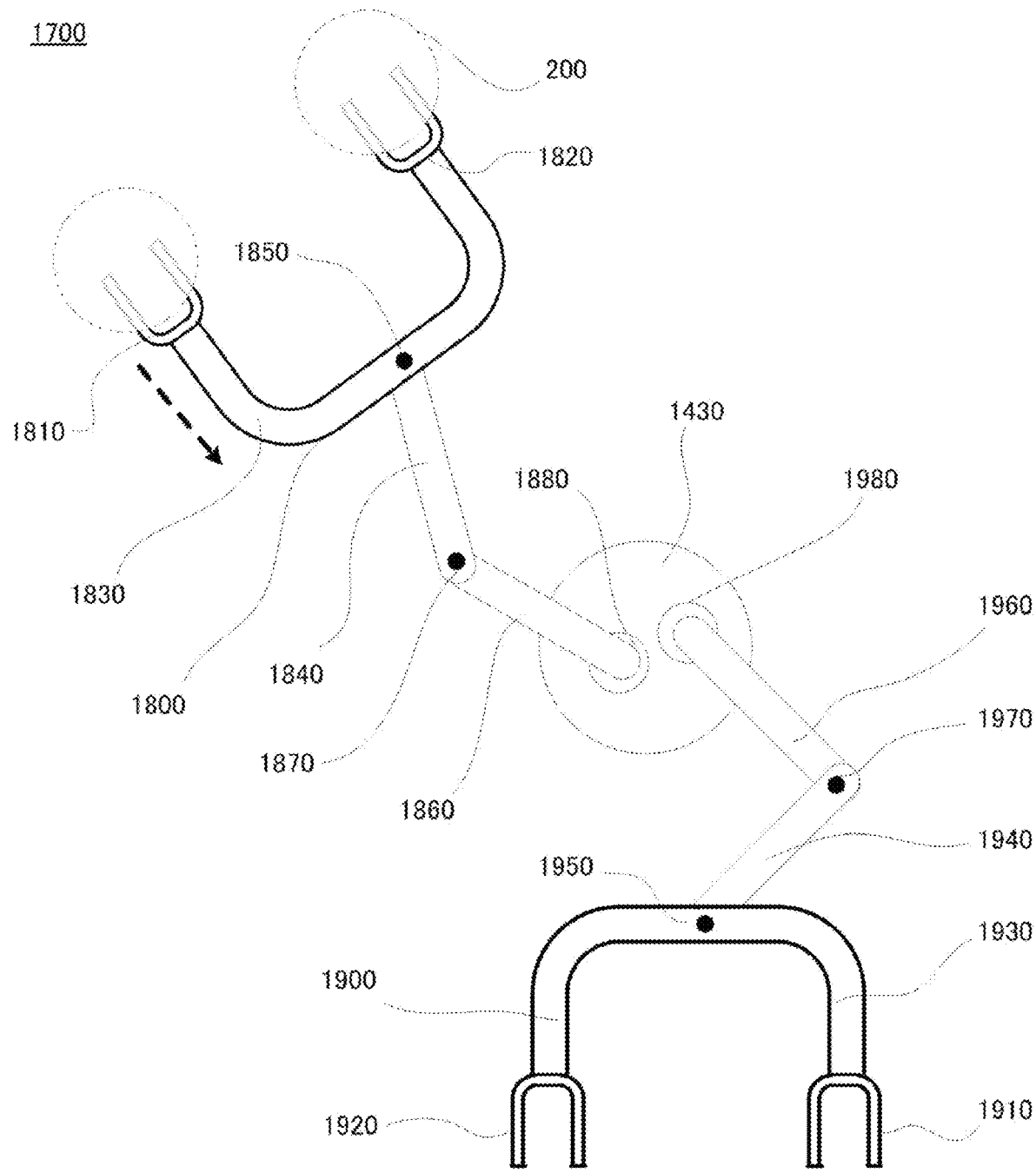
FIG. 3 is a schematic view showing a vacuum transfer robot of the substrate processing system according to an embodiment.
Figure 4:
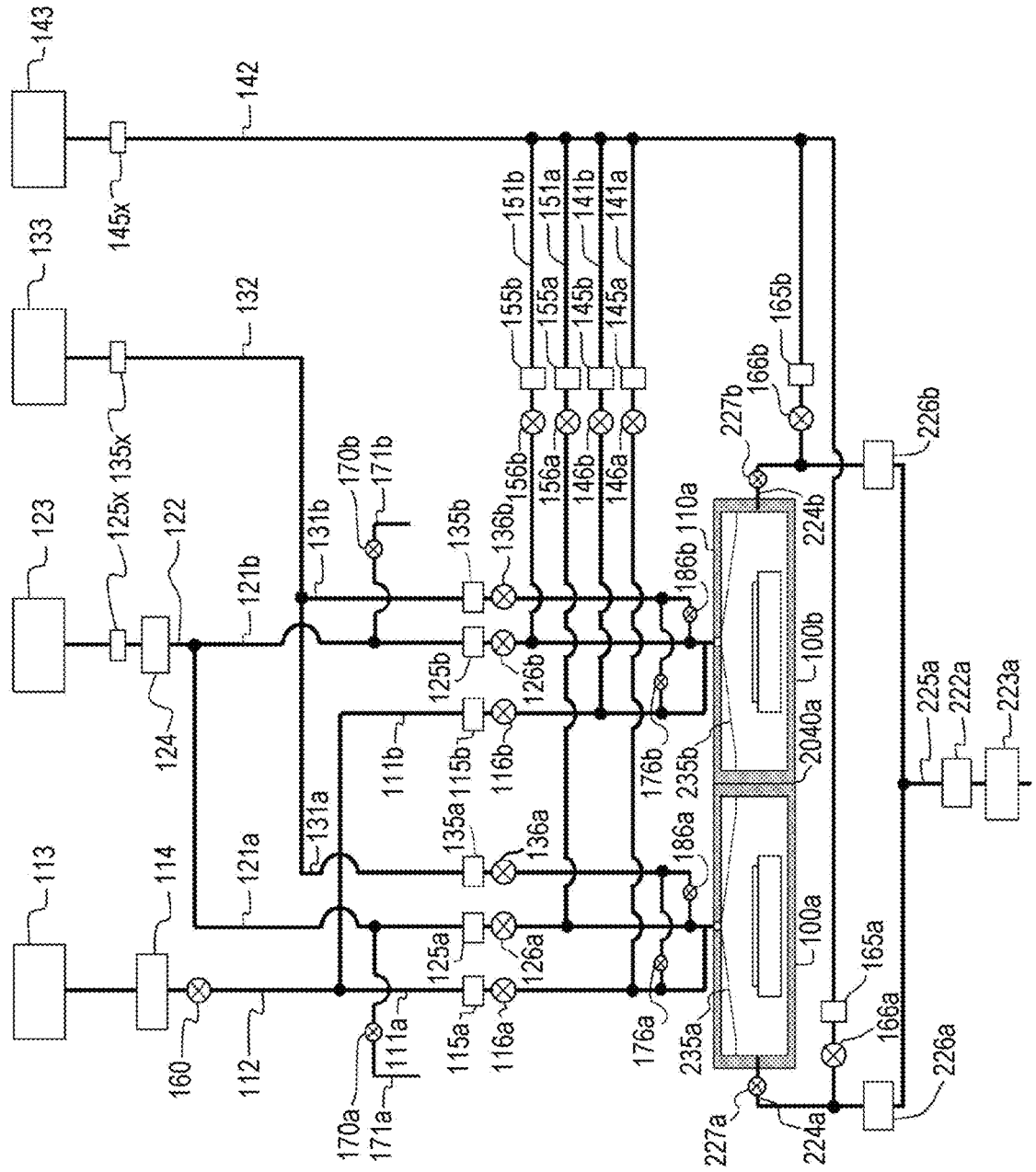
FIG. 4 is a schematic configuration view showing a substrate processing apparatus according to an embodiment.
Figure 5:
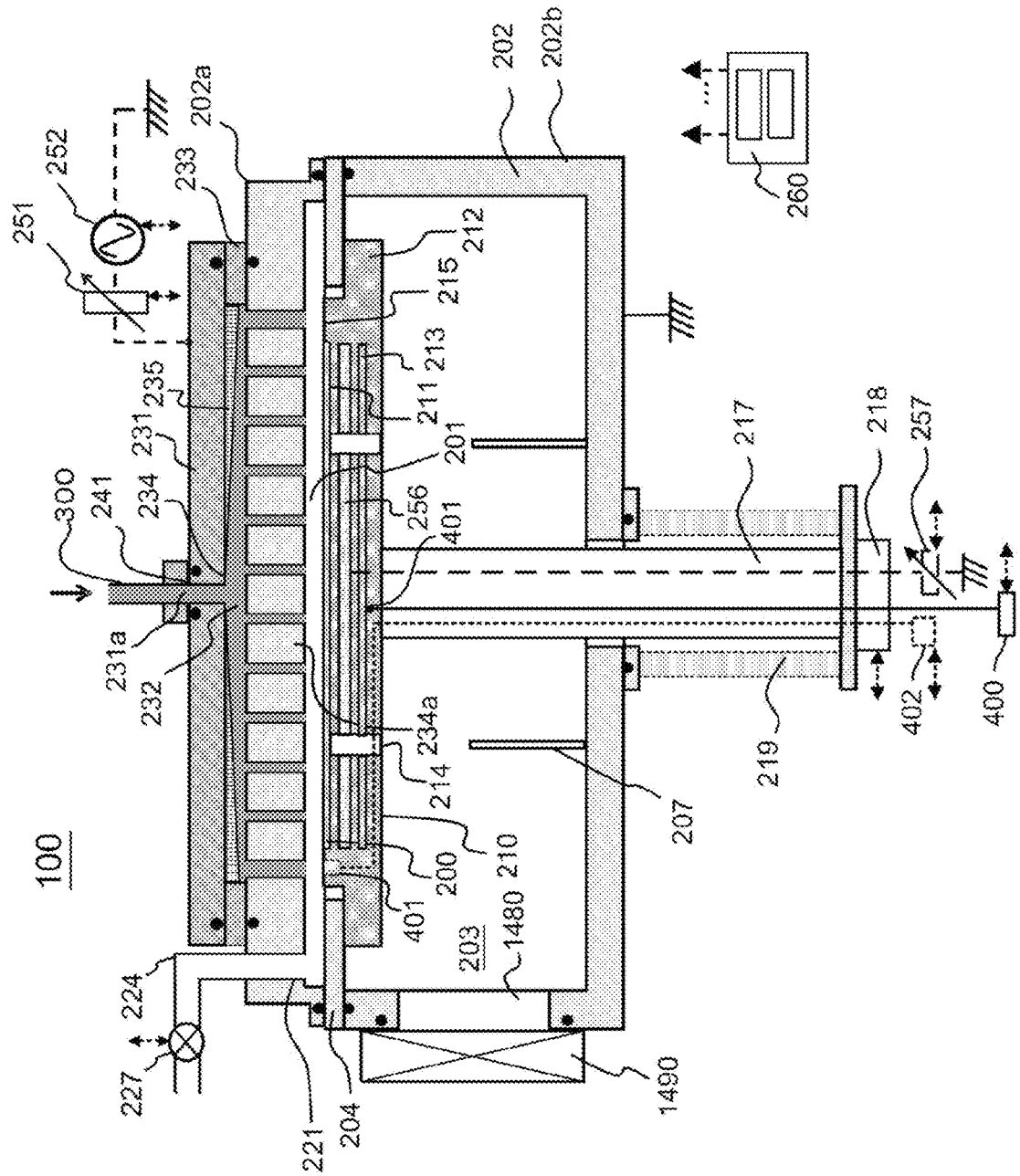
FIG. 5 is a schematic view showing a vertical cross section of a chamber according to an embodiment.

A schematic configuration of a substrate processing system according to an embodiment of the present disclosure will be described with reference to FIGS. 1 to 4. FIG. 1 is a horizontal cross-sectional view showing a configuration example of a substrate processing system according to the present embodiment. FIG. 2 is a vertical cross-sectional view taken along line α-α' in FIG. 1, showing a configuration example of the substrate processing system according to the present embodiment. FIG. 3 is an explanatory view for explaining the details of an arm shown in FIG. 1. FIG. 4 is a vertical cross-sectional view taken along line β-β' in FIG. 1 and is an explanatory view for explaining a gas supply system for supplying a gas to a process module (PM). FIG. 5 is an explanatory view for explaining a chamber provided at the PM.

Referring to FIGS. 1 and 2, the substrate processing system 1000 to which the present disclosure is applied is configured to process a substrate 200 and is mainly configured by an IO stage 1100, an atmosphere transfer chamber 1200, a load lock chamber 1300, a vacuum transfer chamber 1400 and process modules (PMs) 110a to 110d (hereinafter, sometimes simply referred to as "110"). Next, the respective components will be specifically described. In the description of FIG. 1, an X1 direction is right, an X2 direction is left, an Y1 direction is front, and an Y2 direction is rear. A semiconductor device is formed on the surface of the substrate 200. In the substrate processing system 1000, one of semiconductor device manufacturing processes is performed. As used herein, the term "semiconductor device" refers to any one or more of an integrated circuit and an electronic element (a resistance element, a coil element, a capacitor element or a semiconductor element). In addition, the semiconductor device may be a dummy film which is required in the course of manufacturing a semiconductor device.

Atmospheric Transfer Chamber and IO Stage

In front of the substrate processing system 1000, an IO stage (load port) 1100 is installed. A plurality of pods 1001 as storage containers may be mounted on the IO stage 1100. The pod 1001 is used as a carrier for transferring a substrate 200 such as a silicon (Si) substrate or the like. A plurality of substrates (wafers) 200 is stored in the pod 1001 in a horizontal posture. Maximum 25 substrates 200 are stored in the pod 1001. The number of substrates 200 stored in the pod 1001 is adjusted according to the processing result in another substrate processing apparatus and the type of substrates. Less than 25 substrates 200, such as 24, 23, 22 or 21 substrates, may be stored in the pod 1001. The frequency of mounting the pod 1001 storing such a number of substrates 200 on the IO stage 1100 decreases in the order of 25 substrates, 24 substrates, 23 substrates, 22 substrates and 21 substrates.

The pod 1001 is provided with a cap 1120 and is opened or closed by a pod opener 1210 to be described later. The pod opener 1210 is configured to open/close the cap 1120 of the pod 1001 mounted on the TO stage 1100 and open/close the substrate loading/unloading port of the pod 1001, so that the substrate 200 can be loaded and unloaded with respect to the pod 1001. The pod 1001 is supplied to or discharged from the TO stage 1100 by an in-process transfer device (RGV) not shown.

The TO stage 1100 is adjacent to the atmosphere transfer chamber 1200. In the atmosphere transfer chamber 1200, a load lock chamber 1300 to be described later is connected to the surface of the atmosphere transfer chamber 1200 opposite from the TO stage 1100.

In the atmosphere transfer chamber 1200, an atmosphere transfer robot 1220 as a first transfer robot for transferring the substrate 200 is installed. As shown in FIG. 2, the atmosphere transfer robot 1220 is configured to be moved up and down by an elevator 1230 installed in the atmosphere transfer chamber 1200 and is configured to be reciprocated in the left-right direction by a linear actuator 1240.

As shown in FIG. 2, a clean unit 1250 for supplying a clean air is installed at the top of the atmosphere transfer chamber 1200. Furthermore, as shown in FIG. 1, a device (hereinafter referred to as a pre-aligner) 1260 for aligning a notch or an orientation flat, which is formed on the substrate 200, is installed on the left side of the atmosphere transfer chamber 1200.

As shown in FIGS. 1 and 2, a substrate loading/unloading port 1280 for loading or unloading the substrate 200 into or from the atmosphere transfer chamber 1200 and a pod opener 1210 are installed on the front side of a housing 1270 of the atmosphere transfer chamber 1200. An TO stage (load port) 1100 is installed on the opposite side of the pod opener 1210 across the substrate loading/unloading port 1280, i.e., on the outside of the housing 1270.

On the rear side of the housing 1270 of the atmosphere transfer chamber 1200, there is provided a substrate loading/unloading port 1290 for loading or unloading the substrate 200 into or from the load lock chamber 1300. The substrate loading/unloading port 1290 is opened or closed by a gate valve 1330 to be described later, so that the substrate 200 can be loaded and unloaded.

Load Lock (L/L) Chamber

The load lock chamber 1300 is adjacent to the atmosphere transfer chamber 1200. As will be described later, a vacuum transfer chamber 1400 is disposed on the surface of the housing 1310 of the load lock chamber 1300 opposite from the atmosphere transfer chamber 1200. The load lock chamber 1300 is configured to withstand a negative pressure because the pressure in the housing 1310 fluctuates depending on the pressure in the atmosphere transfer chamber 1200 and the pressure in the vacuum transfer chamber 1400.

A substrate loading/unloading port 1340 is provided at the side of the housing 1310 adjacent to the vacuum transfer chamber 1400. The substrate loading/unloading port 1340 is opened or closed by a gate valve 1350, thereby enabling the loading or unloading of the substrate 200.

Furthermore, in the load lock chamber 1300, there is installed a substrate mounting table 1320 having at least two mounting surfaces 1311 for mounting the substrate 200. The two mounting surfaces are a first mounting surface 1311a and a second mounting surface 1311b. The distance between the mounting surfaces 1311 is set according to the distance between the fingers of a vacuum transfer robot 1700 to be described later.

Vacuum Transfer Chamber

The substrate processing system 1000 includes a vacuum transfer chamber (transfer module) 1400 as a transfer chamber which is a transfer space in which the substrate 200 is transferred under a negative pressure. The housing 1410 constituting the vacuum transfer chamber 1400 is formed in the shape of a pentagon in a plan view. The load lock chamber 1300 and the process modules (PM) 110a to 110d for processing the substrate 200 are connected to the respective sides of the pentagon. Approximately at the central portion of the vacuum transfer chamber 1400, a vacuum transfer robot 1700 as a second transfer robot for transferring the substrate 200 under a negative pressure is installed using a flange 1430 as a base. Furthermore, in the vacuum transfer chamber 1400, there is provided a detection sensor 1401 as a detection part for detecting the position of the substrate 200. The detection sensor 1401 is provided, for example, in the vicinity of a connection portion to each PM 110, and is configured to be capable of detecting the movement of the substrate 200 between the vacuum transfer chamber 1400 and the PM 110. The detection sensor 1401 is configured to be capable of transmitting the position data of the substrate 200 to a controller 260 to be described later. Although there is shown an example where the vacuum transfer chamber 1400 is in the shape of a pentagon, the vacuum transfer chamber 1400 may be a polygon such as a quadrangle or a hexagon. Preferably, the PMs are provided in an even number.

A substrate loading/unloading port 1420 is provided at the side wall of the housing 1410 adjacent to the load lock chamber 1300. The substrate loading/unloading port 1420 is opened or closed by a gate valve 1350, so that the substrate 200 can be loaded or unloaded.

As shown in FIG. 2, the vacuum transfer robot 1700 installed in the vacuum transfer chamber 1400 is configured to be able to move up and down while maintaining the airtightness of the vacuum transfer chamber 1400 by the elevator 1450 and the flange 1430. The detailed configuration of the vacuum transfer robot 1700 will be described later. The elevator 1450 is configured to be able to independently raise and lower the two arms 1800 and 1900 of the vacuum transfer robot 1700.

An inert gas supply hole 1460 is provided at the ceiling of the housing 1410 to supply an inert gas into the housing 1410. An inert gas supply pipe 1510 is provided at the inert gas supply hole 1460. An inert gas source 1520, a mass flow controller (MFC) 1530 and a valve 1540 are provided at the inert gas supply pipe 1510 sequentially from the upstream so that the inert gas can be supplied into the housing 1410 at a predetermined flow rate.

An inert gas supply part 1500 in the vacuum transfer chamber 1400 is mainly configured by the inert gas supply pipe 1510, the MFC 1530 and the valve 1540. The inert gas source 1520 and the inert gas supply hole 1460 may be included in the inert gas supply part 1500.

An exhaust hole 1470 for exhausting the atmosphere of the housing 1410 is provided at the bottom wall of the housing 1410. An exhaust pipe 1610 is provided at the exhaust hole 1470. An APC (Auto Pressure Controller) 1620 as a pressure controller and a pump 1630 are provided at the exhaust pipe 1610 sequentially from the upstream side.

A gas exhaust part 1600 in the vacuum transfer chamber 1400 is mainly configured by the exhaust pipe 1610 and the APC 1620. The pump 1630 and the exhaust hole 1470 may be included in the gas exhaust part 1600.

The atmosphere of the vacuum transfer chamber 1400 is controlled by the cooperation of the inert gas supply part 1500 and the gas exhaust part 1600. For example, the pressure in the housing 1410 is controlled.

As shown in FIG. 1, the process modules (PM) 110a, 110b, 110c and 110d for performing desired processes are connected to the side walls on which the load lock chamber 1300 is not installed, among the five side walls of the housing 1410.

Chambers 100a to 100h (hereinafter, sometimes simply referred to as "100") are provided at each of the PMs 110a, 110b, 110c and 110d. The chamber 100 is also referred to as a process chamber. Specifically, the PM 110a is provided with chambers 100a and 100b. The PM 110b is provided with chambers 100c and 100d. The PM 110c is provided with chambers 100e and 100f. The PM 110d is provided with chambers 100g and 100h. Preferably, each PM is provided with an even number of chambers.

A substrate loading/unloading port 1480 is provided at the side wall of the housing 1410 facing each chamber 100. For example, as shown in FIG. 2, a substrate loading/unloading port 1480e is provided at the wall facing the chamber 100e.

In FIG. 2, when the chamber 100e is replaced with the chamber 100a, the substrate loading/unloading port 1480a is provided at the wall facing the chamber 100a.

Similarly, when the chamber 100f is replaced with the chamber 100b, the substrate loading/unloading port 1480b is provided at the wall facing the chamber 100b.

As shown in FIG. 1, the gate valves 1490a to 1490h (hereinafter, sometime simply referred as "1490") is provided for each chamber 100. Specifically, a gate valve 1490a is provided between the chamber 100a and the vacuum transfer chamber 1400, and a gate valve 1490b is provided between the chamber 100b and the vacuum transfer chamber 1400. A gate valve 1490c is provided between the chamber 100c and the vacuum transfer chamber 1400, and a gate valve 1490d is provided between the chamber 100d and the vacuum transfer chamber 1400. A gate valve 1490e is provided between the chamber 100e and the vacuum transfer chamber 1400, and a gate valve 1490f is provided between the chamber 100f and the vacuum transfer chamber 1400. A gate valve 1490g is provided between the chamber 100g and the vacuum transfer chamber 1400, and a gate valve 1490h is provided between the chamber 100h and the vacuum transfer chamber 1400.

By opening or closing the substrate loading/unloading port 1480 with each gate valve 1490, the substrate 200 can be loaded or unloaded through the substrate loading/unloading port 1480.

Vacuum Transfer Robot

Subsequently, the vacuum transfer robot 1700 as a transfer part (transfer mechanism) mounted in the vacuum transfer chamber 1400 will be described with reference to FIG. 3. FIG. 3 is an enlarged view of the vacuum transfer robot 1700 shown in FIG. 1.

The vacuum transfer robot 1700 includes two arms 1800 and 1900. The arm 1800 includes a fork portion 1830 provided with two end effectors 1810 and 1820 at its tip. A middle portion 1840 is connected to the root of the fork portion 1830 via a shaft 1850. A combination of two end effectors and one fork portion is called a holding part. The vacuum transfer robot 1700 includes at least one holding part. One holding part is configured to be able to hold two substrates 200.

The substrates 200 unloaded from the respective PMs 110 are mounted on the end effectors 1810 and 1820. In FIG. 2, there is shown an example in which the substrates 200 unloaded from the PM 110c are mounted on the end effectors 1810 and 1820.

A bottom portion 1860 is connected via a shaft 1870 to the middle portion 1840 at a point opposite from the fork portion 1830. The bottom portion 1860 is disposed on the flange 1430 via a shaft 1880.

The arm 1900 includes a fork portion 1930 provided with two end effectors 1910 and 1920 at its tip. A middle portion 1940 is connected to the root of the fork portion 1930 via a shaft 1950.

The substrates 200 unloaded from the load lock chamber 1300 are mounted on the end effectors 1910 and 1920.

A bottom portion 1960 is connected to the middle portion 1940 at a point opposite from the fork portion 1930 via a shaft 1970. The bottom portion 1960 is disposed on the flange 1430 via a shaft 1980.

The end effectors 1810 and 1820 are disposed higher than the end effectors 1910 and 1920.

The vacuum transfer robot 1700 is rotatable about an axis and can extend the arms.

The vacuum transfer robot 1700 is configured to transfer the substrate transferred to the mounting surface 1311a to the chamber (ch1) 100a, the chamber (ch3) 100c, the chamber (ch5) 100e and the chamber (ch7) 100g, and is configured to transfer the substrate transferred to the mounting surface 1311b to the chamber (ch2) 100b, the chamber (ch4) 100d, the chamber (ch6) 100f and the chamber (ch8) 100h.

Process Module PM

Subsequently, the PM 110a among the respective PMs (process units) 110 will be described with reference to FIGS. 1, 2 and 4. FIG. 4 is an explanatory view for explaining the relationship between the PM 110a, the gas supply part connected to the PM 110a and the gas exhaust part connected to the PM 110a.

Although the PM 110a is taken as an example in the present embodiment, other PMs 110b, 110c and 110d have the same structure. Therefore, the description thereof is omitted here.

As shown in FIG. 4, the PM 110a is provided with two chambers for processing the substrate 200. In the present embodiment, a chamber 100a and a chamber 100b are provided. A partition 2040a is provided between the chamber 100a and the chamber 100b so that the atmospheres in the respective chambers are not mixed with each other.

As shown in FIG. 2, a substrate loading/unloading port 2060e is provided at the wall where the chamber 100e and the vacuum transfer chamber 1400 are adjacent to each other. Similarly, a substrate loading/unloading port 2060a is provided at the wall where the chamber 100a and the vacuum transfer chamber 1400 are adjacent to each other.

Each chamber 100 is provided with a substrate support part 210 for supporting the substrate 200.

A gas supply part for supplying a process gas to each of the chambers 100a and 100b is connected to the PM 110a. The gas supply part includes a first gas supply part (process gas supply part), a second gas supply part (reaction gas supply part), a third gas supply part (first purge gas supply part) and a fourth gas supply part (second purge gas supply part) and the like. The configurations of the respective gas supply parts will be described.

First Gas Supply Part

As shown in FIG. 4, a buffer tank 114, mass flow controllers (MFC) 115a and 115b, and process chamber side valves 116a and 116b are provided between the process gas source 113 and the PM 110a. These components are connected by first gas supply pipes (process gas supply pipes) 112, 111a and 111b. The process gas supplied from the process gas source 113 may be supplied from the first gas supply pipes (process gas supply pipes) 112, 111a and 111b to the chamber 100 via a common gas supply pipe 300 shown in FIG. 5. The MFCs 115a and 115b, the process chamber side valves 116a and 116b and the process gas supply pipes 112, 111a and 111b constitute a first gas supply part. One or both of the process gas source 113 and the buffer tank 114 may be included in the first gas supply part. The same components may be increased or decreased depending on the number of PMs provided at the substrate processing system.

Second Gas Supply Part

As shown in FIG. 4, a remote plasma unit (RPU) 124 as an activation part, MFCs 125a and 125b, and process chamber side valves 126a and 126b (hereinafter, sometimes simply referred to as "126") are provided between the reaction gas source 123 and the PM 110a. The respective components are connected by a reaction gas common pipe 122, second gas supply pipes (reaction gas supply pipes) 121a and 121b and the like. The reaction gas supplied from the reaction gas source 123 may be supplied from the reaction gas common pipe 122 and the second gas supply pipes 121a and 121b to the chamber 100 via the common gas supply pipe 300 shown in FIG. 5. The RPU 124, the MFCs 125a and 125b, the process chamber side valves 126a and 126b, the reaction gas common pipe 122, the reaction gas supply pipes 121a and 121b and the like constitute a second gas supply part. The reaction gas source 123 may be included in the second gas supply part. The same components may be increased or decreased depending on the number of PMs provided in the substrate processing system.

Furthermore, vent lines 171a and 171b and vent valves 170 (170a and 170b) may be provided in front of the process chamber side valves 126a and 126b to exhaust the reaction gas. By providing the vent lines, it is possible to discharge a deactivated reaction gas or a reaction gas having a reduced reactivity without passing through the process chamber.

Third Gas Supply Part (First Purge Gas Supply Part)

As shown in FIG. 4, MFCs 135a and 135b, process chamber side valves 136 (136a and 136b), valves 176a, 176b, 186a and 186b, and the like are provided between the first purge gas (inert gas) source 133 and the PM 110a. These components are connected by a purge gas (inert gas) common pipe 132, purge gas (inert gas) supply pipes 131a and 131b, and the like. The purge gas (inert gas) supplied from the first purge gas source 133 may be supplied from the purge gas common pipe 132 and the purge gas supply pipes 131a and 131b to the chamber 100 via the common gas supply pipe 300 shown in FIG. 5. A third gas supply part is configured by the MFCs 135a and 135b, the process chamber side valves 136 (136a and 136b), the inert gas common pipe 132, the inert gas supply pipes 131a and 131b, and the like. The purge gas (inert gas) source 133 may be included in the third gas supply part (first purge gas supply part). In addition, the same components may be increased or decreased depending on the number of PMs provided in the substrate processing system.

Fourth Gas Supply Part (Second Purge Gas Supply Part)

As shown in FIG. 4, a fourth gas supply part is configured to be able to supply an inert gas to the process chambers 100a and 100b through the process gas supply pipes 111a and 111b and the reaction gas supply pipes 121a and 121b. Second purge gas supply pipes 141a, 141b, 151a and 151b, the MFCs 145a, 145b, 155a and 155b, the valves 146a, 146b, 156a and 156b, and the like are provided between the second purge gas (inert gas) source 143 and the respective supply pipes. The fourth gas supply part (second purge gas supply part) is configured by these components. Although the gas sources of the third gas supply part and the fourth gas supply part are configured separately from each other in the present embodiment, they may be combined and provided as only one gas source.

Each MFC provided at each gas supply part is configured to be capable of transmitting and receiving a flow rate value (flow rate data) to and from a controller 260 described later. Furthermore, each valve is configured to capable of transmitting and receiving a valve opening degree value (valve opening degree data) to and from the controller 260 described later.

Furthermore, a gas exhaust part for exhausting the atmosphere in the chamber 100a and the atmosphere in the chamber 100b is connected to the PM 110a. As shown in FIG. 4, an APC (Auto Pressure Controller) 222a, a common gas exhaust pipe 225a, process chamber exhaust pipes 224a and 224b, and the like are provided between the exhaust pump 223a and the chambers 100a and 100b. The APC 222a, the common supply gas exhaust pipe 225a and the process chamber exhaust pipes 224a and 224b constitute the gas exhaust part. Thus, the atmosphere in the chamber 100a and the atmosphere in the chamber 100b are exhausted by one exhaust pump. Conductance adjustment parts 226a and 226b capable of adjusting the exhaust conductance of each of the process chamber exhaust pipes 224a and 224b may be provided and may be used as one component of the gas exhaust part. Furthermore, the exhaust pump 223a may be used as one component of the gas exhaust part. Moreover, the APC 222a and the conductance adjustment parts 226a and 226b are configured to be capable of transmitting and receiving a valve opening degree data and a pressure value (pressure data) to and from the controller 260 described later.

Next, the chamber 100 according to the present embodiment will be described. As shown in FIG. 5, the chamber 100 is configured as a single-substrate type substrate processing apparatus. In the chamber, one of semiconductor device manufacturing processes is performed. The chambers 100a, 100b, 100c, 100d, 100e, 100f, 100g and 100h are configured in the same manner as the configuration shown in FIG. 5. The chamber 100a will be described here as an example.

As shown in FIG. 5, the chamber 100 is provided with a process container 202. The process container 202 is configured as, for example, a flat sealed container having a circular cross section. The process container 202 is made of, for example, a metallic material such as aluminum (Al) or stainless steel (SUS), or quartz. In the process container 202, there are formed a process space (process chamber) 201 for processing a substrate 200 such as a silicon wafer or the like and a transfer space 203. The process container 202 is composed of an upper container 202a and a lower container 202b. A partition plate 204 is provided between the upper container 202a and the lower container 202b. A space surrounded by the upper container 202a and positioned above the partition plate 204 is called a process space (also referred to as a process chamber) 201. A space surrounded by the lower container 202b and positioned below the partition plate 204 is called a transfer space.

A substrate loading/unloading port 1480 adjacent to a gate valve 1490 is provided at the side surface of the lower container 202b. The substrate 200 moves between the transfer space 203 and the vacuum transfer chamber 1400 shown in FIG. 1 through the substrate loading/unloading port 1480. A plurality of lift pins 207 is provided at the bottom portion of the lower container 202b. Furthermore, the lower container 202b is grounded.

In the process chamber 201, a substrate support part 210 for supporting the substrate 200 is provided. The substrate support unit 210 includes a mounting surface 211 on which the substrate 200 is mounted, and a substrate mounting table 212 having the mounting surface 211. An outer peripheral surface 215 on which the substrate 200 is not mounted is provided at the outer peripheral side of the mounting surface 211. The outer peripheral surface 215 makes it possible to approach the gas supply amount toward the outer peripheral side of the substrate 200 to the gas supply amount toward the center side of the substrate 200. The substrate support part 210 may be provided with a heater 213 as a heating part. By providing the heating part, it is possible to heat the substrate to improve the quality of the film formed on the substrate. Further, the heater 213 is connected to a temperature control part 400 and is configured to be capable of controlling a temperature. The temperature control part 400 is configured to be capable of transmitting and receiving a temperature value (temperature data) to and from the controller 260 to be described later, via a signal line. In the substrate mounting table 212, through holes 214 through which the lift pins 207 pass are respectively provided at positions corresponding to the lift pins 207. The substrate mounting table 212 may be provided with a bias electrode 256 for applying a bias to the substrate 200 or the process chamber 201. The bias electrode 256 is connected to a bias adjustment part 257 and is configured such that the bias can be adjusted by the bias adjustment part 257. The bias adjustment part 257 is configured to be capable of transmitting and receiving a bias value (bias data) to and from the controller 260 to be described later, via a signal line. In addition, the substrate mounting table 212 may be provided with a film thickness monitor 401 for measuring a film thickness of a film formed on the substrate 200. The film thickness monitor 401 is connected to a film thickness meter 402 via a signal line. The film thickness value (film thickness data) generated by the film thickness meter 402 may be transmitted to and received from the below-described controller 260 via a signal line.

The substrate mounting table 212 is supported by a shaft 217. The shaft 217 is installed to penetrate the bottom portion of the process container 202 and is connected to an elevating mechanism 218 outside the process container 202. By raising and lowering the shaft 217 and the substrate mounting table 212 through the operation of the elevating mechanism 218, it is possible to raise and lower the substrate 200 mounted on the mounting surface 211. The periphery of the lower end portion of the shaft 217 is covered with a bellows 219, and the inside of the process chamber 201 is kept airtight. The elevating mechanism 218 is configured to be capable of transmitting and receiving a height data of the substrate mounting table 212 to and from the controller 260 to be described later.

At the time of transferring the substrate 200, the substrate mounting table 212 is lowered so that the mounting surface 211 is at the position of the substrate loading/unloading port 1480 (wafer transfer position). At the time of processing the substrate 200, as shown in FIG. 5, the substrate mounting table 212 is raised to a processing position (wafer processing position) in the process chamber 201.

Specifically, when the substrate mounting table 212 is lowered to the wafer transfer position, the upper end portions of the lift pins 207 protrude from the upper surface of the mounting surface 211 so that the lift pins 207 can support the substrate 200 from below. Furthermore, when the substrate mounting table 212 is raised to the wafer processing position, the lift pins 207 are retracted from the upper surface of the mounting surface 211 so that the mounting surface 211 can support the substrate 200 from below. In addition, since the lift pins 207 make direct contact with the substrate 200, it is desirable that the lift pins 207 are made of, for example, a material such as quartz or alumina. A lifting mechanism may be provided at the lift pins 207 so that the substrate mounting table 212 and the lift pins 207 can move relative to each other.

Exhaust System

An exhaust port 221 as a first exhaust part for exhausting the atmosphere of the process chamber 201 is provided on the inner wall of the process chamber 201 (upper container 202a). A process chamber exhaust pipe 224 is connected to the exhaust port 221, and a valve 227 is connected in series. A first exhaust part (exhaust line) is mainly configured by the exhaust port 221 and the process chamber exhaust pipe 224. The valve 227 may be included in the first exhaust part. The valve 227 may be configured by an APC as a pressure regulator. The valve 227 is configured to be capable of transmitting and receiving a valve opening degree data to and from the controller 260 to be described later.

Gas Introduction Port

A gas introduction port 241 for supplying various gases into the process chamber 201 is provided in the upper wall of the upper container 202a. A common gas supply pipe 300 is connected to the gas introduction port 241. A shower head 234 as a gas dispersion part is provided below the gas introduction port 241.

Gas Dispersion Part

The shower head 234 is composed of a buffer chamber (space) 232 and a dispersion plate 234a having a plurality of holes. The shower head 234 is provided between the gas introduction port 241 and the process chamber 201. The gas introduced from the gas introduction port 241 is supplied to the buffer space 232 of the shower head 234. The shower head 234 is made of, for example, a material such as quartz, alumina, stainless steel, or aluminum.

A lid 231 of the shower head 234 may be used as an electrode and may be made of a conductive metal to provide an activation part (excitation part) for exciting a gas existing in either or both of the buffer space 232 and the process chamber 201. At this time, an insulating block 233 is provided between the lid 231 and the upper container 202a to provide insulation between the lid 231 and the upper container 202a. A matching part 251 and a high-frequency power supply 252 may be connected to the electrode (lid 231) as an activation part so that an electromagnetic wave (high frequency power or microwave) can be supplied to the activation part. The high-frequency power supply 252 is configured to be capable of transmitting and receiving a supplied power value (supplied power data) or a reflected power value (reflected power data) to and from the controller 260 to be described later.

A gas guide 235 for forming a flow of the supplied gas may be provided at the buffer space 232. The gas guide 235 has a conical shape so that the diameter thereof increases in the radial direction of the substrate 200 about the hole 231a.

Supply System

The respective gas supply parts described above are connected to the gas introduction port 241 connected to the lid 231 of the shower head 234. A process gas, a reaction gas and a purge gas are supplied from the respective gas supply parts.

Control Part

As shown in FIG. 5, the chamber 100 includes a controller 260 that controls the operations of the respective parts of the chamber 100.

Figure 6:
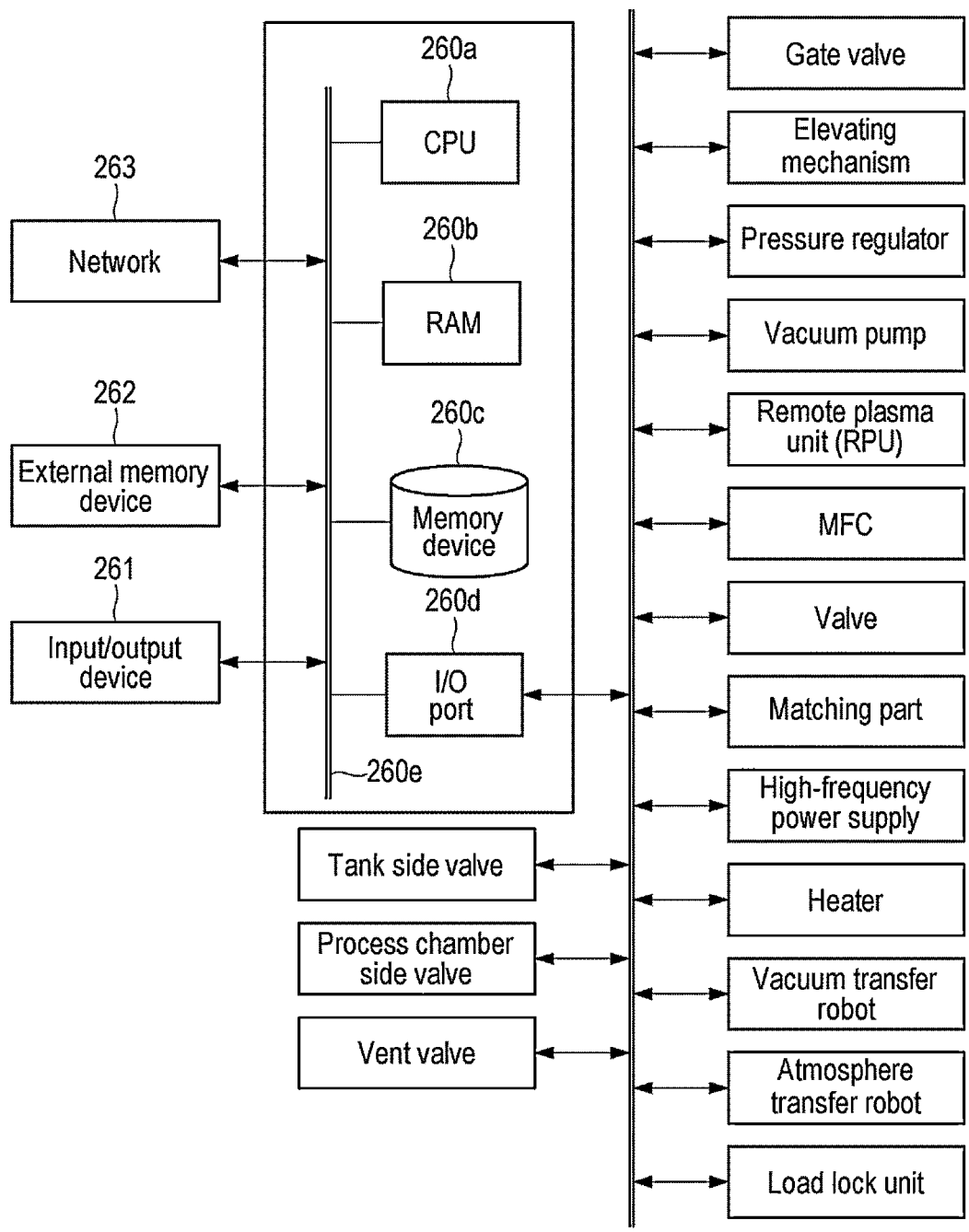
FIG. 6 is a schematic configuration view showing a controller of the substrate processing system according to an embodiment.

The outline of the controller 260 is shown in FIG. 6. The controller 260, which is a control part (control means), is configured as a computer including a central processing unit (CPU) 260a, a random access memory (RAM) 260b, a memory device 260c and an I/O port 260d. The RAM 260b, the memory device 260c and the I/O port 260d are configured to be capable of exchanging data with the CPU 260a via an internal bus 260e. The controller 260 is configured so that an input/output device 261 configured as, for example, a touch panel, and an external memory device 262 can be connected to the controller 260.

The memory device 260c is configured by, for example, a flash memory, a hard disk drive (HDD), or the like. The memory device 260c readably stores a control program for controlling the operation of the substrate processing apparatus, a process recipe in which the procedure and conditions of a substrate processing process described later are written, and the like. The process recipe is combined so as to cause the controller 260 to execute each procedure in the below-described substrate processing process to obtain a predetermined result. The process recipe functions as a program. Hereinafter, the process recipe, the control program and the like are collectively and simply referred to as a program. When the term "program" is used in the subject specification, it may refer to a case including only the process recipe, a case including only the control program, or a case including both the process recipe and the control program. In addition, the RAM 260b is configured as a memory area (work area) in which programs and data read by the CPU 260a are temporarily held.

The I/O port 260d is connected to the gate valves 1330, 1350 and 1490, the elevating mechanism 218, the heater 213, the pressure regulator 222, the vacuum pump 223, the matching part 251, the high-frequency power supply 252, and the like. Furthermore, the I/O port 260d may be connected to the vacuum transfer robot 1700, the atmosphere transfer robot 1220, the load lock chamber 1300, the MFCs 115a and 115b, 125a and 125b, 135a and 135b, 145a and 145b, 155a and 155b, 165a and 165b, and 1530, the valves 227a and 227b, the process chamber side valves 116a and 116b, 126a and 126b, 136a and 136b, 176a and 176b, and 186a and 186b, the tank side valve 160, the vent valves 170 (170a and 170b), the remote plasma unit (RPU) 124, and the like. The term "connection" used in the present disclosure is intended to include not only a meaning that each part is connected by a physical cable, but also a meaning that signals (electronic data) of each part can be directly or indirectly transmitted and received. For example, a device for relaying a signal or a device for converting or computing a signal may be provided between the respective parts.

The CPU 260a is configured to read and execute the control program from the memory device 260c and to read the process recipe from the memory device 260c in response to the input of an operation command from the input/output device 261. In addition, the CPU 260a is configured to, according to the contents of the process recipe thus read, control the opening/closing operations of the gate valves 1330, 1350 and 1490 (1490a, 1490b, 1490c, 1490d, 1490e, 1490f, 1490g and 1490h), the elevating operation of the elevating mechanism 218, the operation of supplying electric power to the heater 213, the pressure regulation operation of the pressure regulators 222 (222a) and 238, the on/off control of the vacuum pump 223, the gas activation operation of the remote plasma unit 124, the flow rate adjustment operation of the MFCs 115a and 115b, 125a and 125b), 135a and 135b, the gas supply/cutoff operations of the valves 237 (237e and 237θ), the process chamber side valves 116a and 116b, 126 (126a, 126b, 126c and 126d), 136 (136a and 136b), 176 (176a and 176b) and 186 (186a and 186b), the tank side valve 160 and the vent valves 170 (170a and 170b), the power matching operation of the matching part 251, the on/off operation of the high-frequency power supply 252, and the like.

The controller 260 is not limited to being configured as a dedicated computer but may be configured as a general-purpose computer. For example, the controller 260 according to the present embodiment may be configured by preparing an external memory device (e.g., a magnetic tape, a magnetic disk such as a flexible disk or a hard disk, an optical disk such as a CD or a DVD, a magneto-optical disk such as an MO or the like, or a semiconductor memory such as a USB memory or a memory card) 262 that stores the aforementioned program, and installing the program in a general-purpose computer using the external memory device 262. The means for supplying the program to the computer is not limited to the case of supplying the program via the external memory device 262. For example, the program may be supplied by using a communication means such as a network 263 (the Internet or a dedicated line) without going through the external memory device 262. The memory device 260c or the external memory device 262 is configured as a non-transitory computer-readable recording medium. Hereinafter, the memory device 260c and the external memory device 262 will be generally and simply referred to as a "recording medium." When the term "recording medium" is used in the subject specification, it may indicate a case of including only the memory device 260c, a case of including only the external memory device 262, or a case of including both the memory device 260c and the external memory device 262.

(2) First Substrate Processing Step

Next, as one of processes of manufacturing a semiconductor device using a process furnace of the above-described substrate processing apparatus, a sequence example in which an insulating film, for example, a silicon oxide (SiO) film as a silicon-containing film, is formed on a substrate will be described with reference to FIGS. 7 and 8. In the following description, the operations of the respective parts constituting the substrate processing apparatus are controlled by the controller 260.

In the subject specification, the use of the word "substrate" is the same as the use of the word "wafer." In that case, "substrate" may be replaced with "wafer" in the above description.

A first substrate processing step S200A will be described below.

Substrate Loading Step S201

In the first substrate processing step S200A, first, the substrate 200 is loaded into the process chamber 201. Specifically, the substrate support part 210 is lowered by the elevating mechanism 218 so that the lift pins 207 protrude from the through holes 214 toward the upper surface side of the substrate support part 210. Furthermore, after the pressure in the process chamber 201 is adjusted to a predetermined pressure, the gate valve 1490 is opened, and the substrate 200 is mounted on the lift pins 207. After the substrate 200 is mounted on the lift pins 207, the substrate support part 210 is raised to a predetermined position by the elevating mechanism 218, whereby the substrate 200 is mounted on the substrate support part 210 from the lift pins 207.

Pressure Reduction/Temperature Increasing Step
S202

Subsequently, the inside of the process chamber 201 is evacuated through the process chamber exhaust pipe 224 so that the pressure in the process chamber 201 becomes a predetermined pressure (degree of vacuum). At this time, the valve opening degree of the APC as the pressure regulator 222 (222a) is feedback-controlled based on the pressure value measured by a pressure sensor. Furthermore, based on the temperature value detected by a temperature sensor (not shown), the amount of current supplied to the heater 213 is feedback-controlled so that the temperature in the process chamber 201 becomes a predetermined temperature. Specifically, the substrate support part 210 is preheated by the heater 213, and the substrate 200 is heated to a predetermined temperature by the heated substrate support part 210. The substrate 200 or the substrate support part 210 may be left for a certain period of time until the temperature change thereof disappears. During this time, if moisture remains in the process chamber 201 or if a gas is separated from a member, the moisture or the gas may be removed by vacuum evacuation or purge through the supply of an $N_2$ gas. Thus, the preparation before a film-forming process is completed. When the inside of the process chamber 201 is evacuated to a predetermined pressure, the evacuation may be first performed to a reachable degree of vacuum.

Film-Forming Step S210

Subsequently, the details of a film-forming step S210 will be described. The film-forming step S210 will be described with reference to FIGS. 7 and 8 by taking, as an example, a process of forming a SiO film on the substrate 200.

Figure 7:
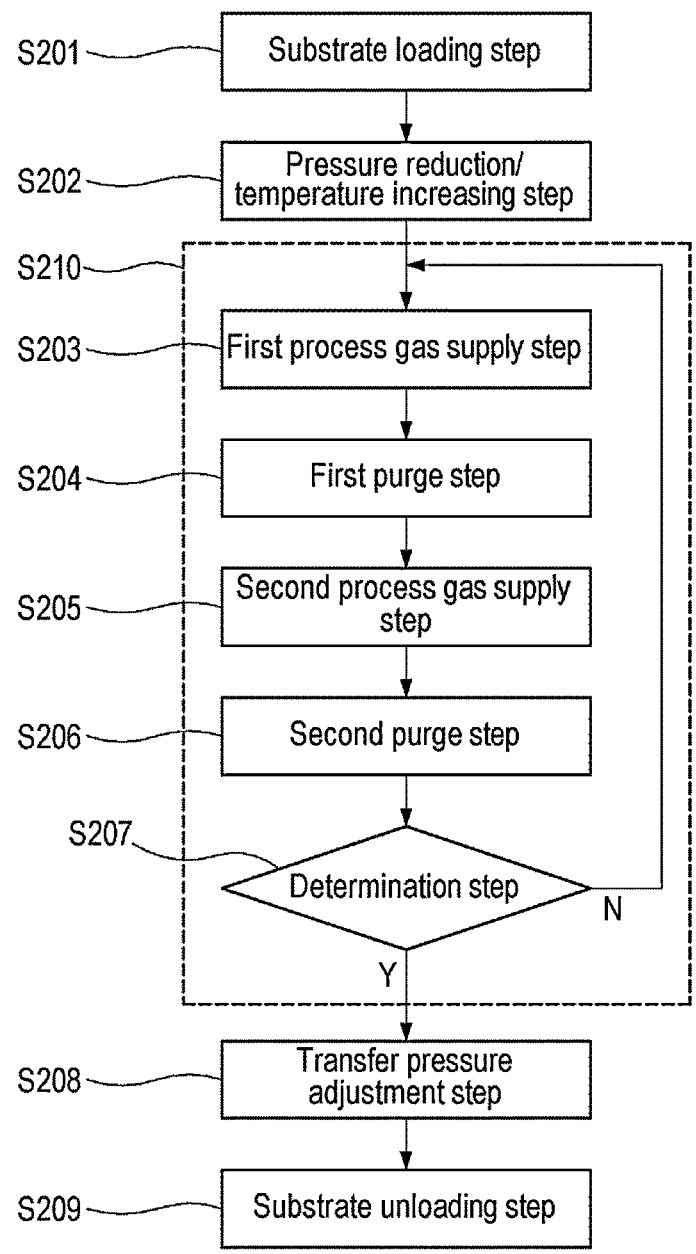
FIG. 7 is a flowchart showing a first substrate processing process according to an embodiment.
Figure 8:
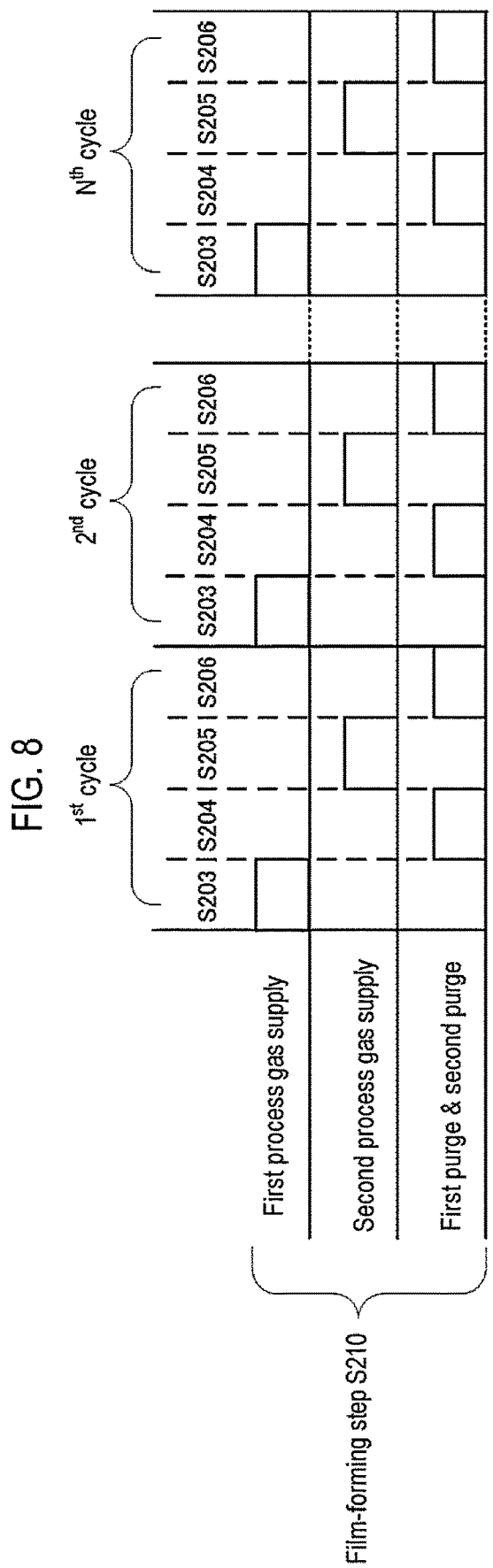
FIG. 8 is a sequence diagram showing the first substrate processing process according to an embodiment.

After the substrate 200 is placed on the substrate support part 210, steps S203 to S207 shown in FIGS. 7 and 8 are performed.

First Gas Supply Step S203

In the first gas supply step S203, an aminosilane-based gas as a first gas (precursor gas) is supplied from the first gas supply part into the process chamber 201. Examples of the aminosilane-based gas include a bisdiethylaminosilane ($H_2Si(NEt_2)_2$, abbreviation: BDEAS) gas. Specifically, the gas valve 160 is opened to supply the aminosilane-based gas from the gas source to the chamber 100. At that time, the process chamber side valve 116a is opened, and the flow rate of the aminosilane-based gas is adjusted to a predetermined flow rate by the MFC 115a. The flow rate-adjusted aminosilane-based gas passes through the buffer space 232 and is supplied from the holes of the shower head 234 into the process chamber 201 kept in a reduced pressure state. Furthermore, the evacuation of the inside of the process chamber 201 by the exhaust system is continued, and the pressure in the process chamber 201 is controlled to become a predetermined pressure range (first pressure). At this time, the aminosilane-based gas to be supplied to the substrate 200 is supplied into the process chamber 201 at a predetermined pressure (first pressure: e.g., 100 Pa or more and 20000 Pa or less). Thus, the aminosilane-based gas is supplied to the substrate 200. By supplying the aminosilane-based gas, a silicon-containing layer is formed on the substrate 200.

The temperature of the heater 213 at this time is set to a constant temperature falling within a range of 200 to 750 degrees C., preferably 300 to 600 degrees C., more preferably 300 to 550 degrees C. This temperature is maintained at least until the film-forming step S210 is completed.

First Purge Step S204

After the silicon-containing layer is formed on the substrate 200, the gas valves 116a and 116b of the first gas supply pipes 111a and 111b are closed to stop the supply of the aminosilane-based gas. By stopping the supply of the precursor gas, the precursor gas present in the process chamber 201 and the precursor gas present in the buffer space 232 are exhausted from the process chamber side exhaust pipe 224, whereby a first purge step S204 is performed.

Furthermore, in the purge step, in addition to merely discharging the gas by exhaust (evacuation), an inert gas may be supplied to perform a discharge process of pushing out a residual gas. Specifically, the valves 136a and 136b are opened to supply an inert gas. The inert gas is, for example, a nitrogen ($N_2$) gas. Furthermore, the evacuation and the supply of the inert gas may be performed in combination. Moreover, the evacuation and the supply of the inert gas may be alternately performed.

In the first purge step, the operation of the vacuum pump 223 is continued, and the gas present in the process chamber 201 is exhausted by the vacuum pump 223.

After a predetermined time has elapsed, the valves 136a and 136b are closed to stop the supply of the inert gas.

The supply flow rate of the $N_2$ gas as a purge gas supplied from each inert gas supply system is set to, for example, a flow rate falling within a range of 100 to 20000 sccm. In addition to the $N_2$ gas, a rare gas such as Ar, He, Ne, Xe or the like may be used as the purge gas.

Second Process Gas Supply Step S205

After the first gas purge step, the valve 126 is opened, and an oxygen-containing gas as a second gas (reaction gas) is supplied into the process chamber 201 through the gas introduction port 241, the buffer space 232 and the shower head 234. Examples of the oxygen-containing gas include an oxygen gas ($O_2$), an ozone gas ($O_3$), water ($H_2O$), a nitrous oxide gas ($N_2O$) and the like. An example using the $O_2$ gas is shown here. Since the oxygen-containing gas is supplied into the process chamber 201 through the buffer space 232 and the shower head 234, it is possible to uniformly supply the gas onto the substrate. Therefore, the film thickness can be made uniform. When supplying the second gas, the activated second gas may be supplied into the process chamber 201 via the remote plasma unit (RPU) 124 as an activation part (excitation part).

At this time, the MFCs 125a and 125b are adjusted so that the flow rate of the $O_2$ gas becomes a predetermined flow rate. The supply flow rate of the $O_2$ gas is, for example, 100 sccm or more and 10000 sccm or less. Furthermore, the pressure in the process chamber 201 is brought into a predetermined pressure range by properly adjusting the pressure regulator 222a. In addition, when the $O_2$ gas is flowing in the RPU 124, the RPU 124 may be controlled to be in an ON state (a state in which the power is turned on), thereby activating (exciting) the $O_2$ gas.

When the $O_2$ gas is supplied to the silicon-containing layer formed on the substrate 200, the silicon-containing layer is modified. For example, a modified layer containing elemental silicon is formed. By providing the RPU 124 and supplying the activated $O_2$ gas onto the substrate 200, it is possible to form a larger modified layer.

The modified layer is formed at a predetermined thickness, a predetermined distribution and a penetration depth of a predetermined oxygen component or the like with respect to the silicon-containing layer according to the pressure in the process chamber 201, the flow rate of the $O_2$ gas, the temperature of the substrate 200 and the power supply condition of the RPU 124.

After a predetermined time has elapsed, the valve 126 is closed to stop the supply of the $O_2$ gas.

Second Purge Step S206

By stopping the supply of the $O_2$ gas, the $O_2$ gas present in the process chamber 201 and the $O_2$ gas present in the buffer space 232 are exhausted from the first exhaust part, whereby the second purge step S206 is performed. In the second purge step S206, the same process as that of the above-described first purge step S204 is performed.

Determination Step S207

After completion of the second purge step S206, the controller 260 determines whether steps S203 to S206 of the film-forming step S210 have been performed by a predetermined number of cycles C (where C is a natural number). That is, it is determined whether a film having a desired thickness is formed on the substrate 200. By performing one cycle including steps S203 to S206 at least one time (step S207), it is possible to form an insulating film, i.e., an SIO film containing silicon and oxygen and having a predetermined thickness is formed on the substrate 200. The above cycle is preferably repeated a plurality of times. Thus, an SiO film having a predetermined thickness is formed on the substrate 200.

If the cycle has not been performed a predetermined number of times (in the case of N determination), the cycle of steps S203 to S206 is repeated. If the cycle has been performed a predetermined number of times (in the case of Y determination), the film-forming step S301 is ended to perform a transfer pressure adjustment step S208 and a substrate unloading step S209.

Transfer Pressure Adjustment Step S208

In the transfer pressure adjustment step S208, the inside of the process chamber 201 and the inside of the transfer space 203 are evacuated via the process chamber side exhaust pipe 224 so that the pressure in the process chamber 201 and the pressure in the transfer space 203 becomes a predetermined pressure (degree of vacuum). The pressure in the process chamber 201 and the pressure in the transfer space 203 at this time is adjusted to be equal to or higher than the pressure in the vacuum transfer chamber 1400. The lift pins 207 may be configured to hold the substrate 200 so that the substrate 200 is cooled to a predetermined temperature during, before or after the transfer pressure adjustment step S208.

Substrate Unloading Step S209

After the inside of the process chamber 201 reaches a predetermined pressure in the transfer pressure adjustment step S208, the gate valve 1490 is opened, and the substrate 200 is unloaded from the transfer space 203 to the vacuum transfer chamber 1400.

By virtue of such steps, the processing of the substrate 200 is performed.

By the way, the inventors have found that when plural kinds of film-forming steps are performed in the substrate processing apparatus including the plurality of chambers 100 as shown in FIG. 1, at least one of the following problems [A] to [D] occurs.

[A]

There is a case where the integrated time for the process of the film-forming step S210 performed in each of the plurality of chambers 100 and the integrated film thickness of the film deposited in the chamber 100 are different. In such a case, the maintenance timing of the chamber 100 becomes different for each chamber 100. Due to the difference in maintenance timing, there is posed a problem that the productivity in the substrate processing apparatus is reduced.

In order to solve the aforementioned problem, it may be possible to adopt a method in which a process is stopped only in the chamber 100 under maintenance while performing a process in the chamber 100 not under maintenance. However, it is necessary to change the transfer path of the substrate 200 every time. Therefore, the decrease in the productivity of the substrate processing apparatus is inevitable.

Figure 9:
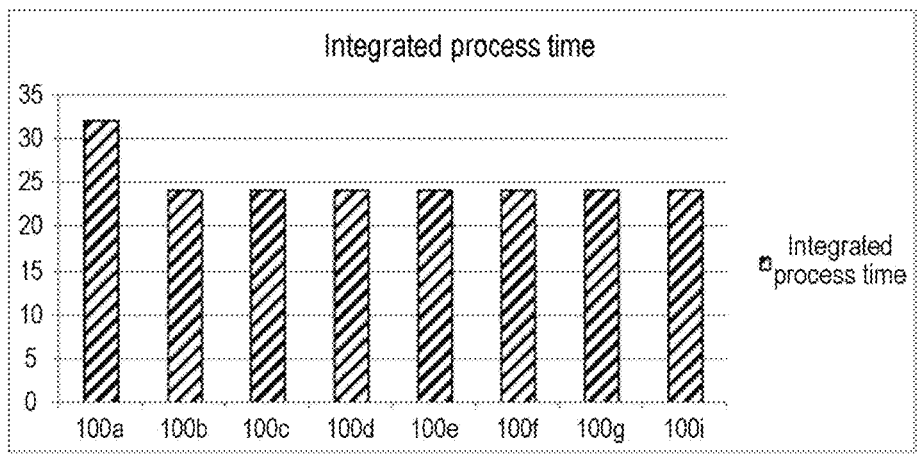
FIG. 9 is a diagram showing an integrated process time according to a conventional transfer sequence.

An example in which the integrated process time is different will be described with reference to FIGS. 9 and 10. In FIGS. 9 and 10, the horizontal axis represents the chambers 100a to 100i of the PMs 110a to 110d (corresponding to the PMs 1, 2, 3 and 4 in the figures), and the vertical axis represents the process time [arbitrary unit]. White portions indicate the processing of odd-numbered pods 1001, and adjacent shaded portions indicate the processing of even-numbered pods 1001. FIGS. 9 and 10 are views obtained by counting and graphing the process time when a process is performed using eight pods 1001 each having 25 substrates 200 and the integrated process time of the respective chambers 100. FIG. 9 shows a case where the initially-transferred first and second substrates 200 among the substrates 200 stored in each pod 1001 are transferred to the PM 110a (PM 1). FIG. 10 shows a case where the initially-transferred first and second substrates 200 among the substrates 200 stored in each pod 1001 are transferred to the PM 110 next to the PM 110 where the last substrate 200 of the previous pod 1001 has been processed. Specifically, FIG. 10 shows an example in which, when the last substrate 200 among the substrates 200 stored in the first pod 1001 is processed in the chamber 100a of the PM 110a (PM 1), the initial first and second substrates 200 among the substrates 200 stored in the next pod 1001 are transferred from the chamber 100c and the chamber 100d of the PM 110b (PM 2). In other words, the example of FIG. 10 is an example in which the substrate is transferred and processed sequentially from the chamber 100 (PM) having the smallest number of processes.

As shown in FIGS. 9 and 10, when the substrate 200 is processed in each chamber with the process time set to 1 [arbitrary unit], the integrated time is dispersed and the maintenance timing is different. The reason is explained below.

As shown in FIG. 9, when 200 substrates 200 are processed, a time difference of 8 [arbitrary unit] occurs between the chamber 100a and other chambers. In the case of FIG. 10, a time difference of 2 [arbitrary unit] occurs between the chambers 100a, 100c, 100e and 100g and the chambers 100b, 100d, 100f and 100i.

In addition, since this integrated time is not simply proportional to the number of times of use of each chamber 100 (the number of times of processing in each chamber 100), it becomes difficult to estimate the maintenance timing based on the number of times of processing. For example, when the method of manufacturing a semiconductor device is directed to a small-amount/many-kind method, the process time is dispersed for each processing lot and each pod 1001. Thus, the chamber 100 having a short integrated process time may be generated even if the number of time of processing is large. Furthermore, as shown in FIG. 10, when the substrate is sequentially transferred from the chamber 100 (PM) having the smallest number of times of processing, the number of times of use of a specific chamber 100 is biased. For example, there is posed a problem that the integrated process time of the most frequently used chamber continues to be kept long, resulting in a reduction in the performance of the specific chamber 100.

[B]

In the case where a plurality of chambers 100 is provided in the PM, the exhaust system is common to the plurality of chambers. Therefore, while the substrate 200 is processed in one chamber 100, maintenance cannot be performed in other chambers. On the other hand, if maintenance is performed, by-products may be generated in the exhaust pipe and may flow into one of the chambers 100. In addition, the pressure in one of the chambers 100 may be affected. In this way, during the maintenance of one chamber 100 in the PM, the processing in the other chamber 100 may be limited. Therefore, there is posed a problem that the substrate 200 cannot be processed by the PM having the chamber 100 under maintenance, consequently reducing the productivity in the substrate processing apparatus. For example, in the example of FIG. 9, in PM 1, the chamber 100b cannot be used during the maintenance of the chamber 100a. In the example of FIG. 10, all the PMs cannot be used.

[C]

When a plurality of chambers 100 is provided in the PM, there may be a case where the substrate 200 is transferred to one of the chambers 100 in the PM and the process in the PM is started without transferring the substrate 200 to the other chamber 100 in the PM. In this case, a normal substrate processing process is performed in the chamber 100 to which the substrate 200 is transferred. This is called a normal deposition. On the other hand, in the other chamber 100 to which the substrate 200 is not transferred, a film is formed on the mounting surface 211 of the substrate mounting table 212. Such a process is called a false deposition. When the integrated time of the false deposition increases, the atmosphere in the chamber 100 in which the normal deposition is performed differs from the atmosphere in the chamber 100 in which the false deposition is performed. This poses a problem that the characteristics of the film formed on the substrate 200 are changed in each chamber 100. In addition, there is posed a problem that, as the integrated time of the normal deposition increases, the number and frequency of generation of particles grows larger as compared with the chamber 100 in which the normal deposition is performed. On the other hand, as the integrated time of the false deposition increases, a film is deposited on the mounting surface 211 of the substrate support part 210. When plasma processing is performed on the substrate 200 in this state, there is a problem that charge-up damage is likely to be given to the substrate 200. Furthermore, a problem is arises that the maintenance timing is different between the chamber 100 in which the normal deposition is performed and the chamber 100 in which the false deposition is performed. Since a film is formed on the mounting surface 211 in the chamber 100 where the false deposition has been performed, it takes time and effort to change the maintenance contents for each chamber 100. For example, in order to remove the film formed on the mounting surface 211, it may be necessary to prolong the cleaning time. However, In the case of prolonging the cleaning time, there may cause a problem that the shower head 234, the inner wall of the upper container 202a, the surface of the partition plate 204, the outer peripheral surface 215 of the substrate mounting table 212, and the like are over-etched to greatly change the atmosphere of the process chamber 201. Furthermore, when the gas supply part and the gas exhaust part are shared by a plurality of chambers as shown in FIG. 4, there may cause a problem that, even if the desired cleaning is completed in one chamber, cleaning may not be completed in the other chamber having a large film thickness. In addition, a problem arises that, if the cleaning of the other chamber 100 is completed, one chamber 100 may be over-etched.

[D]

In up-to-date semiconductor devices, a laminated structure has become a mainstream as in 3D-NANDs. In this structure, a film of the same type is deposited a plurality of times. In this structure, it is required that the film characteristics of each of a plurality of films fall within a predetermined film characteristic range. Thus, the film of the same type may be formed by the same substrate processing apparatus. However, there is a problem that the environment in the chamber 100 is changed for each film formation and the film characteristics of each of a plurality of films do not fall within a predetermined range.

As used herein, the term "film characteristics" include, for example, a film thickness, a film quality, crystallinity, a dielectric constant, a refractive index, a film density, an etching rate and the like. The change of the environment in the chamber 100 occurs, for example, as follows. (1) The base pressure in the chamber 100 is changed according to the integrated film thickness of the film formed on the surface of the member in the chamber 100. (2) The environment in the gas pipe of each gas supply system is changed according to the integrated gas supply time for the chamber 100. (3) The amount of particles generated in each chamber 100 increases depending on the integrated film thickness or the integrated process time.

The inventors have found that at least one of the above-mentioned problems can be solved by executing a correction step for the substrate transfer step. A substrate transfer flow including the correction step will be described with reference to FIGS. 11, 12, 13 and 14.

Substrate Transfer Step

Figure 11:
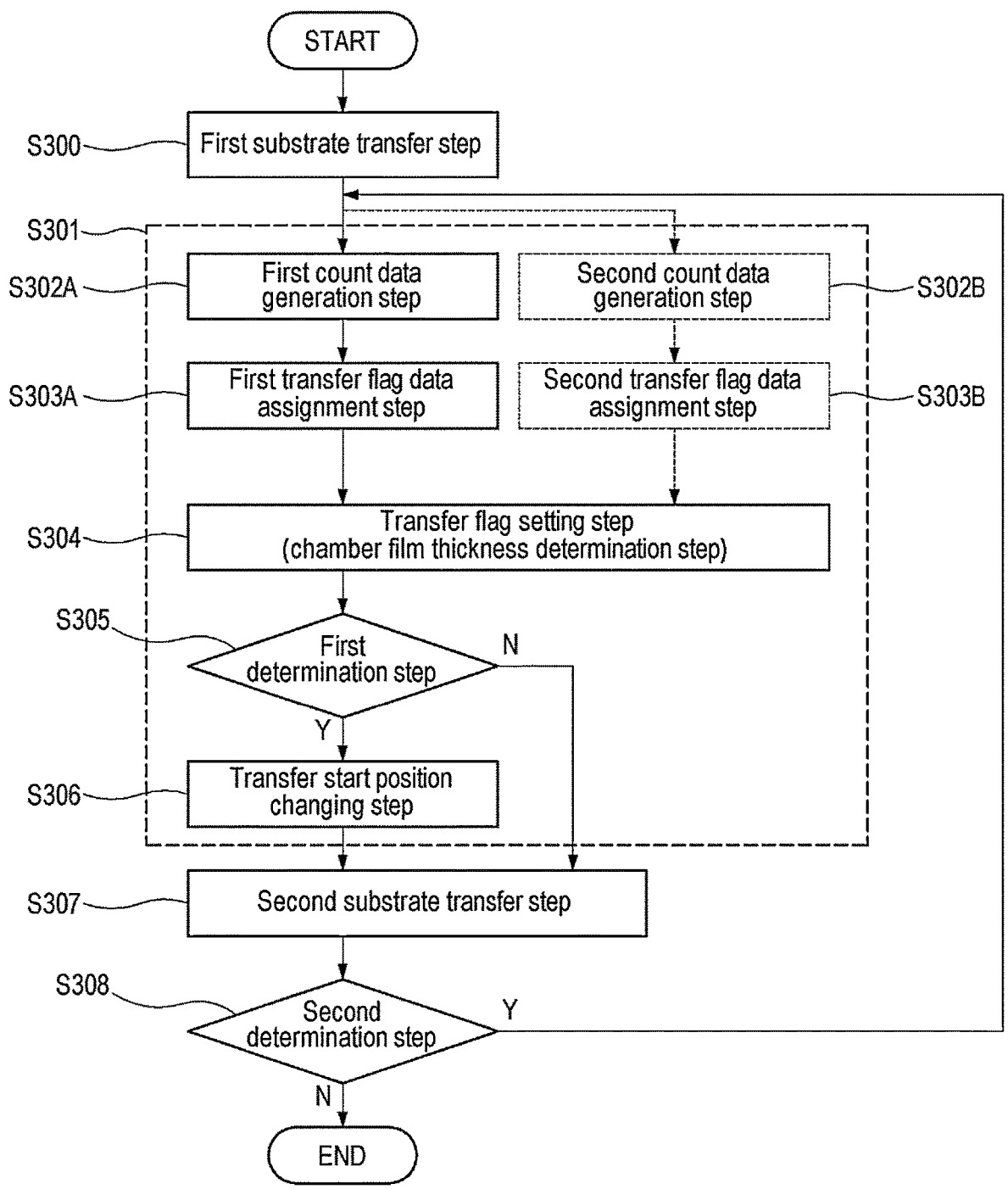
FIG. 11 is a flowchart showing a substrate transfer process according to an embodiment.

First, the substrate transfer step will be described with reference to FIG. 11. FIG. 11 is a substrate transfer flowchart including a correction step for the substrate transfer step according to an embodiment.

First Substrate Transfer Step S300

The substrates 200 are transferred to the plurality of chambers 100 in a predetermined order from the pod 1001 as a storage container and are sequentially processed in the respective chambers 100. As used herein, the term "predetermined order" means that, for example, the substrates 200 are transferred in the order of the chamber 100a, the chamber 100b, the chamber 100c, the chamber 100d, the chamber 100e, the chamber 100f, the chamber 100g, the chamber 100h, the chamber 100i, the chamber 100a, the chamber 100b, . . . , and so forth. The transfer does not have to be started from the chamber 100a. The predetermined order in the case of starting the transfer from the chamber 100c is an order of the chamber 100c, the chamber 100d, the chamber 100e, the chamber 100f, the chamber 100g, the chamber 100h, the chamber 100i, the chamber 100a, the chamber 100b, the chamber 100c, the chamber 100d . . . , and so forth. The transfer of the substrates 200 from the pod 1001 to the respective chambers 100 is repeatedly performed until the processing target substrates 200 in the pod 1001 disappear. After the first substrate transfer step S300 is completed, a correction step S301 for the substrate transfer step is performed.

Correction Step S301

In the correction step S301, a first count data generation step S302A, a first transfer flag data assignment step S303A, a first determination step S305 and a transfer start position changing step S306 are performed. The respective steps will be described below.

First Count Data Generation Step S302A

First, the CPU 260a as an operation part of the controller 260 generates (counts) first count data corresponding to each of the plurality of process chambers, and stores the first count data in the memory device 260c as a memory part. In this regard, the first count data includes the following. For example, the first count data is the integrated process time in the chamber 100, the cumulative film thickness, the integrated supply time of the process gas, the integrated supply time of the reaction gas, the integrated maintenance time of the process pressure, the integrated time during which the substrate mounting table 212 is maintained at the process temperature, the integrated discharge time of the plasma generated in the process chamber 201, and the like, which is available when a process is performed in a state in which the substrate 200 is not present in the chamber 100. The first count data is selected from at least one of them. Two or more of them may be selected to generate (count) the first count data. As used herein, the expression "a state in which the substrate 200 is not present in the chamber 100" means a state in which the substrate 200 is not mounted on the substrate support part 210 or a state in which each gas can be supplied to the mounting surface 211. The first count data generation step is also referred to as a count step of first count data.

An example of a data table in which the first count data is recorded (counted) is shown in FIG. 12. In the data table shown in FIG. 12, the first count data corresponding to each chamber 100 is inputted to each data input box. Specifically, the integrated process time data corresponding to each chamber 100 is recorded in A1, B1, C1, . . . , and I1, and the integrated time data of the maintenance temperature corresponding to each chamber 100 is recorded in A2, B2, C2, . . . , and I2. The integrated supply amount data of the process gas corresponding to each chamber 100 is recorded in A3, B3, C3, . . . , and I3. The integrated maintenance time data of the process pressure corresponding to each chamber 100 is recorded in A4, B4, C4, . . . , and I4. The cumulative film thickness data corresponding to each chamber 100 is recorded in A5, B5, C5, . . . , and I5. The high-frequency power supply amount data corresponding to each chamber 100 is recorded in A6, B6, C6, . . . , and I6. In the present embodiment, the integrated process time, the integrated time of the maintenance temperature, the integrated supply amount of the process gas, the integrated maintenance time of the process pressure, the cumulative film thickness, and the high-frequency power amount are shown as the first count data. However, the first count data may be composed of one of them. The above data may be added to the data shown in FIG. 12, or a part of the data shown in FIG. 12 may be replaced by any of the above data. The cumulative film thickness may be measured by providing a film thickness meter 402 in the process chamber 201, or may be calculated based on any of the integrated supply time of one or both of the process gas and the reaction gas, the pressure, the number of processed substrates 200 and the like without providing the film thickness meter 402. In addition, when film thickness data is inputted to a film formation recipe, the cumulative film thickness may be calculated based on the film thickness data of the film formation recipe and the number of times of execution of the film formation recipe. Preferably, the cumulative film thickness may be calculated separately from the film thickness of the film formed on the inner wall of the process chamber 201 and the film thickness of the film formed on the substrate support part 210. Furthermore, the film thickness of the film formed on the lower surface (the surface facing the mounting surface 211) of the dispersion plate 234a may be calculated.

Second Count Data Generation Step 302B

As indicated by a broken line in FIG. 11, the second count data generation step S302B may be performed in parallel with the first count data generation step S302A. The second count data is the integrated process time in the chamber 100, the cumulative film thickness, the integrated supply time of the process gas, the integrated supply time of the reaction gas, the integrated maintenance time of the process pressure, the integrated time during which the substrate mounting table 212 is maintained at the process temperature, the integrated discharge time of the plasma generated in the process chamber 201, and the like, which is available when a process is performed in a state in which the substrate 200 is present in the chamber 100. The second count data is selected from at least one of them. Two or more of them may be selected to generate (count) the second count data. The second count data generation step is also referred to as a count step of second count data.

First Transfer Flag Data Assignment Step S303A

Subsequently, a comparison operation is performed on each of the first count data corresponding to the plurality of process chambers, thereby generating first transfer flag data. Specifically, the respective first count data corresponding to the plurality of process chambers are compared to assign first transfer flag data to the chamber 100 corresponding to the largest first count data among the first count data. An example of a data table of the first transfer flag data is shown in FIG. 13. FIG. 13 shows a state in which the comparison operation is performed using the integrated process time as the first count data and the result is recorded in the input boxes Xa, Xb, Xc, . . . , and Xi of the first transfer flag data. In FIG. 13, "1" as a flag is stored in the input box Xa of the chamber 100a having the longest integrated process time as the first count data. In another input box, "0" is stored as a state having no flag. When flag data is already inputted to each input box, the data in each input box is changed based on the calculation result.

Second Transfer Flag Data Assignment Step S303B

A comparison operation may be performed on the respective second count data corresponding to the plurality of process chambers in parallel with the first transfer flag data assignment step S303A, thereby generating second transfer flag data. Specifically, the respective second count data corresponding to the plurality of process chambers are compared to assign second transfer flag data to the next chamber 100 of the chamber 100 corresponding to the largest second count data among the second count data. The example of the data table of the second transfer flag data is the same as the example of the data table of the first transfer flag data.

Transfer Flag Setting Step S304

Subsequently, a transfer flag setting step S304 for selecting transfer flag data is performed. In this regard, the transfer flag data includes, for example, first transfer flag data and second transfer flag data. The transfer flag data is selected based on the film thickness table recorded in the memory device 260c.

The film thickness table will be described with reference to FIGS. 15, 16 and 17. The film thickness table records at least one or more of the film thickness of the film deposited on the wall surface of the process chamber 201, the film thickness of the film deposited on the substrate support part 210 and the film thickness of the film deposited on the dispersion plate 234a. For example, as shown in FIG. 15, the film thickness of the wall surface of the process chamber 201 (process chamber wall surface) is recorded in A1. As shown in FIG. 15, the film thickness for each measurement may be recorded as B1, C1, and so forth. Furthermore, as shown in FIG. 16, the table may be a table in which the film thickness of the substrate support part 210 is recorded in A2. As shown in FIG. 16, the film thickness for each measurement may be recorded as B2, C2, and so forth. Furthermore, as shown in FIG. 17, the film thickness of the process chamber wall surface, the film thickness of the film deposited on the substrate support part 210 and the film thickness of the film deposited on the dispersion plate 234a may be recorded. Each film thickness is calculated and recorded in the same manner as described above.

Subsequently, the selection procedure of the transfer flag data will be described. The film thickness table in which each film thickness data is recorded is read from the memory device 260c, and the film thickness value recorded in the film thickness table is compared with a reference value.

First, a comparison is performed as to whether the film thickness of the substrate support part 210 is equal to or greater than a first specified value. The first specified value is set in a range of, for example, 0.5 μm or more and 2.5 μm or less. In the present embodiment, an example in which the first specified value is set to 2.0 μm will be described. A comparison is performed as to whether the film thickness of the substrate support part 210 shown in FIG. 16 is equal to or greater than the first specified value (2.0 μm). As a result of comparison, if the film thickness of the substrate support part 210 is equal to or greater than the first specified value, the first transfer flag data is selected. If the film thickness of the substrate support part 210 is smaller than the first specified value, the second transfer flag is selected. In FIG. 16, since the film thicknesses of measurement 1 and measurement 2 are smaller than the first specified value, "2" indicating the second transfer flag data is selected as the transfer flag data F1 and F2. Since the film thickness of measurement 3 is equal to or greater than the first specified value, "1" indicating the first transfer flag data is selected as the transfer flag data F3.

Next, a comparison is performed as to whether the film thickness of the wall surface of the process chamber 201 is equal to or greater than a second specified value. The second specified value is set in a range of, for example, 1 µm to 4 µm. In the present embodiment, an example in which the second specified value is set to 3.0 µm will be described. A comparison is conducted as to whether the film thickness of the wall surface of the process chamber 201 shown in FIG. 15 is equal to or greater than the second specified value (3.0 µm). As a result of comparison, if the film thickness of the wall surface of the process chamber 201 is equal to or greater than the second specified value, the second transfer flag data is selected. If the film thickness of the wall surface of the process chamber 201 is smaller than the second specified value, the first transfer flag is selected. In FIG. 15, since the film thicknesses of measurement 1 and measurement 2 are smaller than the second specified value, "1" indicating the first transfer flag data is selected as the transfer flag data f1 and f2. Since the film thickness of measurement 3 is equal to or greater than the second specified value, "2" indicating the second transfer flag data is selected as the transfer flag data f3.

The second specified value may be set greater than the first specified value. This is because the film deposited on the substrate support part 210 and the film deposited on the wall surface of the process chamber 201 may have different influences on film formation. The film deposited on the substrate support part 210 affects the charge amount of the substrate 200 mounted on the substrate support part 210. On the other hand, the film deposited on the wall surface of the process chamber 201 affects the generation of particles. This is because, while the frequency of generation of particles increases at 1 µm or more, the change in the charge amount occurs at 0.5 µm or more.

Furthermore, either the selection of the transfer flag data based on the film thickness of the wall surface of the process chamber 201 or the selection of the transfer flag data based on the film thickness of the substrate support part 210 may be executed. However, both of them may be executed depending on the case. For example, when the number of processed substrates 200 in the substrate processing apparatus 100 is small, only the selection of the transfer flag data based on the film thickness of the substrate support part 210 is executed. When the number of processed substrates 200 in the substrate processing apparatus 100 exceeds a predetermined number, the selection of the transfer flag data based on the film thickness of the wall surface of the process chamber 201 may be executed.

In the transfer flag setting step S304 described here, there is shown an example of selection based on the film thickness table. However, the present disclosure is not limited thereto. The following method may be employed. For example, the number of processes at the time of performing a process in a state in which the substrate 200 is present in in each chamber 100 and the number of processes at the time of performing a process in a state in which the substrate 200 is not present in in each chamber 100 may be recorded, and the transfer flag may be selected based on the relationship between the numbers of processes.

First Determination Step S305

Subsequently, a first determination step S305 is performed. In the first determination step, it is determined whether the transfer flag data has been changed. As a result of the determination, if the transfer flag data has been changed (in the case of Y determination), a next transfer start position changing step S306 is performed. If the transfer flag data has not been changed (in the case of N determination), a next second substrate transfer step S307 is performed without performing the transfer start position change step S306.

Transfer Start Position Changing Step S306

Subsequently, a transfer start position changing step S306 executed after the Y determination is made in the first determination step S305 will be described. In the case of Y determination, the setting of the substrate transfer recipe is updated so as to start the transfer from the chamber 100 to which a transfer flag is assigned. In the example shown in FIG. 13, the transfer flag is assigned to the chamber 100a. Therefore, in the next substrate transfer step, the setting of the substrate transfer recipe is updated so that the substrate 200 to be transferred first is transferred to the chamber 100b. In this manner, the substrate is transported from the next chamber of the chamber 100 corresponding to the largest count number among the plurality of first count data. Depending on the transfer flag, the transfer destination of the substrate 200 to be transferred first may be the same before and after updating the substrate transfer recipe.

Second Substrate Transfer Step S307

Subsequently, a second substrate transfer step S307 is performed. In the second substrate transfer step S307, the substrates are sequentially transferred to the chambers 100 in the same procedure as the first substrate transfer step S300 based on the substrate transfer recipe until the processing target substrates 200 in the pod 1001 disappear.

Second Determination Step S308

Next, a second determination step S308 is performed. In the second determination step S308, it is determined whether the pod 1001 to be processed next is mounted on the IO stage 1100. If the pod 1001 to be processed next is present (in the case of Y determination), the correction step S301 is performed. The correction step S301 and the second substrate transfer step S307 are performed repeatedly until the pod 1001 to be processed disappears. If the pod 1001 to be processed next is not present (in the case of N determination), the substrate processing process is ended.

The substrate processing process of the present disclosure is performed in this way.

Although one embodiment of the present disclosure has been specifically described above, the present disclosure is not limited to the above-described embodiment and may be variously modified without departing from the gist thereof.

For example, although the substrate transfer order in the unit of the chamber 100 is corrected based on the first count data in the above description, the substrate transfer order may be corrected in the unit of the PM by the following configuration. For example, as shown in FIG. 14, third count data corresponding to each PM may be generated based on the first count data corresponding to each chamber. In this regard, the third count data is the data obtained by adding the first count data corresponding to the chambers 100 of the PM. Specifically, the third count data AB1 corresponding to the PM 1 is the data obtained by adding the first count data A1 and B1. The third count data corresponding to other PMs is similarly calculated. Although the third count data is calculated based on the two first count data in the present embodiment, when the PM includes three or more chambers 100, the third count data may be calculated based on three or more first count data. Furthermore, although there has been shown an example in which addition is simply performed, the third count data may be calculated by arbitrary arithmetic processing.

Furthermore, the number of processing target substrates 200 stored in the pod 1001 may not be divisible by the number of chambers of the substrate processing system 1000. In this case, a chamber 100 to which the substrate 200 is transferred and a chamber 100 to which the substrate 200 is not transferred are generated in the PM for processing the last substrate 200 among the processing target substrates 200 stored in the pod 1001. In such a case, the third count data may be calculated based on the first count data of zero without generating the first count data corresponding to the chamber 100 to which the substrate 200 has not been transferred. For example, this is a state shown in the lower part of each input box in FIG. 14. The lower part in FIG. 14 shows a case where the substrate 200 has not been transferred to the chamber 100b. In this case, the integrated process time is 0, and the integrated process time corresponding to the chamber 100a is the third count data. When comparison operation is performed between this third count data and other third count data, the third count data corresponding to the PM 1 is minimized. Therefore, no transfer flag is assigned to the PM 1, and a transfer flag is assigned to the PM 2. Calculation may be performed in this way.

Furthermore, although the method of forming the film by alternately supplying the precursor gas and the reaction gas has been described above, other methods are also applicable as long as the amount of gas phase reaction between the precursor gas and the reaction gas and the amount of generation of by-products fall within an allowable range. For example, it may be possible to adopt a method in which the supply timings of the precursor gas and the reaction gas overlap with each other.

Moreover, although the PM including two chambers as a set has been described above, the present disclosure is not limited thereto. The PM may include 3 or more chambers as a set. In the case of three or more chambers, when the substrate is transferred to one chamber and the substrate is not transferred to at least one other chamber other than the one chamber, the process gas may be supplied to one chamber, and the inert gas may be supplied to other chambers, whereby the above-described effects can be obtained.

Furthermore, although the single-substrate type processing apparatus for processing the substrates one by one has been described above, the present disclosure is not limited thereto. It may be possible to adopt a batch type processing apparatus in which a plurality of substrates is arranged vertically or horizontally in a process chamber.

Furthermore, although the film-forming process has been described above, the present disclosure is also applicable to other processes. For example, the present disclosure may be applied to a diffusion process, an oxidation process, a nitriding process, an oxy-nitriding process, a reduction process, an oxidation reduction process, an etching process, a heat treatment process, and the like. For example, the present disclosure may also be applied to a case where a substrate surface or a film formed on a substrate is subjected to a plasma oxidation process or a plasma nitriding process using only a reaction gas. In addition, the present disclosure may be applied to a plasma annealing process which makes use of only a reaction gas.

Furthermore, although the semiconductor device manufacturing process has been described above, the present disclosure may be applied to processes other than the semiconductor device manufacturing process. For example, the present disclosure may be applied to substrate processing processes such as a liquid crystal device manufacturing process, a solar cell manufacturing process, a light emitting device manufacturing process, a glass substrate processing process, a ceramic substrate processing process, a conductive substrate processing process and the like.

Furthermore, although the example in which the silicon oxide film is formed using the silicon-containing gas as the precursor gas and the oxygen-containing gas as the reaction gas has been described above, the present disclosure is also applicable to film formation using other gases. For example, the present disclosure may be applied to the formation of an oxygen-containing film, a nitrogen-containing film, a carbon-containing film, a boron-containing film, a metal-containing film, and a film containing a plurality of these elements. These films include, for example, a SiN film, an AlO film, a ZrO film, an HfO film, an HfAlO film, a ZrAlO film, a SiC film, a SiCN film, a SiBN film, a TiN film, a TiC film, a TiAlC film and the like.

According to the present disclosure in some embodiments, it is possible to improve the productivity in a processing apparatus having a plurality of process chambers.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus, comprising:
   a load port capable of mounting a plurality of storage containers storing a plurality of substrates, each of the plurality of substrates including a semiconductor device formed thereon;
   a plurality of process chambers each configured to be capable of accommodating at least one of the plurality of substrates;
   a transfer part configured to transfer at least one of the plurality of substrates from the plurality of storage containers to one of the plurality of process chambers; and
   a controller configured to be capable of:
      controlling the transfer part to transfer at least one of the plurality of substrates from a first storage container among the plurality of storage containers to the plurality of process chambers in a predetermined order;
      if a predetermined process is performed in a process chamber, among the plurality of process chambers, to which no substrate is transferred, updating first count data for the process chamber to which no substrate is transferred; and when at least one of the plurality of substrates is transferred from a second storage container among the plurality of storage containers to the plurality of process chambers in the predetermined order, controlling the transfer part to transfer the at least one of the plurality of substrates, in the predetermined order, from a process chamber, among the plurality of process chambers, for which the first count data is the largest.

2. The substrate processing apparatus of claim 1, wherein the controller is further configured to be capable of:

if the predetermined process is performed in a process chamber, among the plurality of process chambers, to which the substrate is transferred, updating second count data for the process chamber to which the substrate is transferred; and when the at least one of the plurality of substrates is transferred from the second storage container, controlling the transfer part to transfer the at least one of the plurality of substrates, in the predetermined order, from a process chamber, among the plurality of process chambers, which differs from a process chamber, among the plurality of process chambers, for which the second count data is the largest.

3. The substrate processing apparatus of claim 2, wherein the controller is further configured to be capable of:

assigning first transfer flag data to the process chamber, among the plurality of process chambers, for which the first count data is the largest; and assigning second transfer flag data to one or more process chambers, among the plurality of process chambers, which differ from the process chamber for which the second count data is the largest.

4. The substrate processing apparatus of claim 3, further comprising a memory configured to store film thickness data of each part within the plurality of process chambers, wherein the controller is further configured to be capable of selecting the first transfer flag data or the second transfer flag data based on the film thickness data.

5. The substrate processing apparatus of claim 4, wherein the film thickness data indicates at least film thickness data of a substrate support configured to support the substrate, and wherein the controller is further configured to be capable of selecting the first transfer flag data if the film thickness data exceeds a first specified value.

6. The substrate processing apparatus of claim 4, wherein the film thickness data indicates at least film thickness data of a process chamber wall surface, and wherein the controller is further configured to be capable of selecting the second transfer flag data if the film thickness data exceeds a second specified value.

7. A method of processing a substrate, comprising:

mounting a plurality of storage containers, which contains a plurality of substrates, on a load port, each of the plurality of substrates including a semiconductor device formed thereon;

transferring at least one of the plurality of substrates from a first storage container among the plurality of storage containers to a plurality of process chambers in a predetermined order;

performing a process in each of the plurality of process chambers;

counting first count data for a process chamber, among the plurality of process chambers, in which the process is performed in a state in which no substrate is transferred thereto; and when at least one of the plurality of substrates is transferred from a second storage container among the plurality of storage containers to the plurality of process chambers in the predetermined order, transferring the at least one of the plurality of substrates, in the predetermined order, from a process chamber, among the plurality of process chambers, for which the first count data is the largest.

8. The method of claim 7, further comprising:

if the process is performed in a process chamber, among the plurality of process chambers, to which the substrate is transferred, updating second count data for the process chamber to which the substrate is transferred; and when the at least one of the plurality of substrates is transferred from the second storage container, transferring at least one of the plurality of substrates, in the predetermined order, from a process chamber, among the plurality of process chambers, which differs from a process chamber for which the second count data is the largest.

9. The method of claim 8, further comprising:

assigning first transfer flag data to the process chamber, among the plurality of process chambers, for which the first count data is the largest;

assigning second transfer flag data, in a predetermined order, to one or more process chambers, among the plurality of process chambers, which differ from the process chamber for which the second count data is the largest; and selecting the first transfer flag data or the second transfer flag data based on film thickness data of each part within the plurality of process chambers.

10. The method of claim 9, wherein the film thickness data indicates film thickness data of a substrate support configured to support the substrate, and wherein the method further comprises selecting the first transfer flag data if the film thickness data of the substrate support exceeds a first specified value.

11. The method of claim 9, wherein the film thickness data indicates film thickness data of a process chamber wall surface, and wherein the method further comprises selecting the second transfer flag data if the film thickness data of the process chamber wall surface exceeds a second specified value.

12. A method of manufacturing the semiconductor device, comprising the method of claim 7.

13. A non-transitory computer-readable recording medium storing a program that causes, by a computer, a substrate processing apparatus to perform a process comprising:

mounting a plurality of storage containers, which contains a plurality of substrates, on a load port, each of the plurality of substrates including a semiconductor device formed thereon;

transferring at least one of the plurality of substrates from a first storage container among the plurality of storage containers to a plurality of process chambers in a predetermined order;

performing a process in each of the plurality of process chambers;

counting first count data for a process chamber, among the plurality of process chambers, in which the process is performed in a state in which no substrate is transferred thereto; and when at least one of the plurality of substrates is transferred from a second storage container among the plurality of storage containers to the plurality of process chambers in the predetermined order, transferring the at least one of the plurality of substrates, in the predetermined order, from a process chamber, among the plurality of process chambers, for which the first count data is the largest.

14. The non-transitory computer-readable recording medium of claim 13, wherein the process further comprises:

if the process is performed in a process chamber, among the plurality of process chambers, to which the substrate is transferred, updating second count data for the process chamber to which the substrate is transferred; and when the at least one of the plurality of substrates is transferred from the second storage container, transferring at least one of the plurality of substrates, in the predetermined order, from a process chamber, among the plurality of process chambers, which differs from a process chamber for which the second count data is the largest.

15. The non-transitory computer-readable recording medium of claim 14, wherein the process further comprises:

assigning first transfer flag data to the process chamber, among the plurality of process chambers, for which the first count data is the largest;

assigning second transfer flag data, in a predetermined order, to one or more process chambers, among the plurality of process chambers, which differ from the process chamber for which the second count data is the largest; and selecting the first transfer flag data or the second transfer flag data based on film thickness data of each part within the plurality of process chambers.

16. The non-transitory computer-readable recording medium of claim 15, wherein the film thickness data indicates film thickness data of a substrate support configured to support the substrate, and wherein the process further comprises selecting the first transfer flag data if the film thickness data of the substrate support exceeds a first specified value.

17. The non-transitory computer-readable recording medium of claim 15, wherein the film thickness data indicates film thickness data of a process chamber wall surface, and wherein the process further comprises selecting the second transfer flag data if the film thickness data of the process chamber wall surface exceeds a second specified value.

* * * * *